United States Patent [19]

Oshida et al.

[11] Patent Number: 4,862,008

[45] Date of Patent: Aug. 29, 1989

[54] METHOD AND APPARATUS FOR OPTICAL ALIGNMENT OF SEMICONDUCTOR BY USING A HOLOGRAM

[75] Inventors: Yoshitada Oshida, Fujisawa; Naoto Nakashima; Yasuhiro Yoshitake, both of Yokohama, all of Japan

[73] Assignee: Hitachi, Ltd., Tokyo, Japan

[21] Appl. No.: 213,141

[22] Filed: Jun. 29, 1988

[30] Foreign Application Priority Data

Jun. 30, 1987 [JP] Japan .............................. 62-161296

[51] Int. Cl.⁴ ............................................ G01N 21/86
[52] U.S. Cl. ..................................... 250/548; 356/401
[58] Field of Search ........................ 250/202, 548, 571; 356/152, 399–401; 372/57

[56] References Cited

U.S. PATENT DOCUMENTS

| | | | |
|---|---|---|---|
| 4,668,089 | 5/1987 | Oshida et al. | 356/152 |
| 4,677,301 | 6/1987 | Tanimoto et al. | 250/548 |
| 4,771,180 | 9/1988 | Nomura et al. | 250/548 |
| 4,779,986 | 10/1988 | Nakashima et al. | 356/400 |

OTHER PUBLICATIONS

Proceedings of SPIE-The International Society for Optical Engineering, vol. 633, 1986.

Primary Examiner—David C. Nelms
Assistant Examiner—Stephone B. Allen
Attorney, Agent, or Firm—Antonelli, Terry & Wands

[57] ABSTRACT

A wafer is aligned by using an alignment light having a longer wavelength than an exposure light. Exposure and alignment are effected through a common reduction lens. A wavefront aberration caused by the use of the long wavelength alignment light is compensated by a hologram. Thus, an alignment precision is improved without exposing a resist layer to a light.

40 Claims, 19 Drawing Sheets

U.S. Patent   Aug. 29, 1989   Sheet 1 of 19   4,862,008
FIG. IA
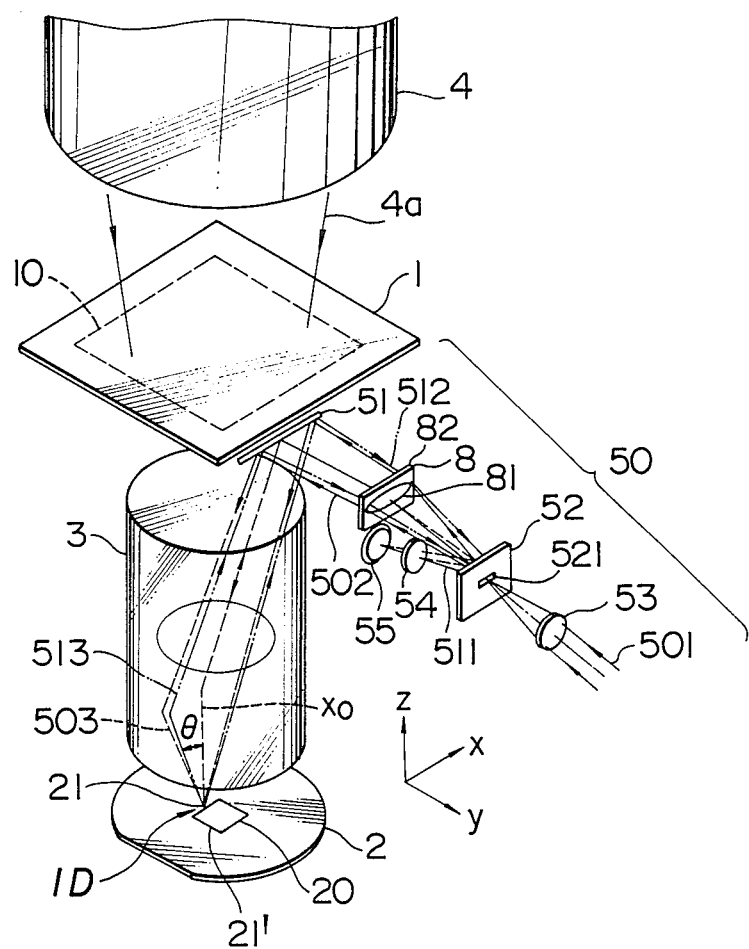
FIG. ID
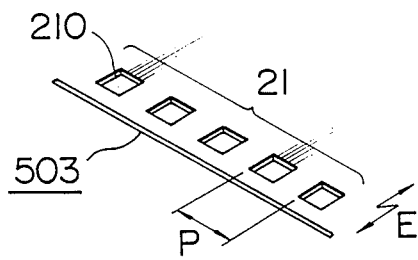

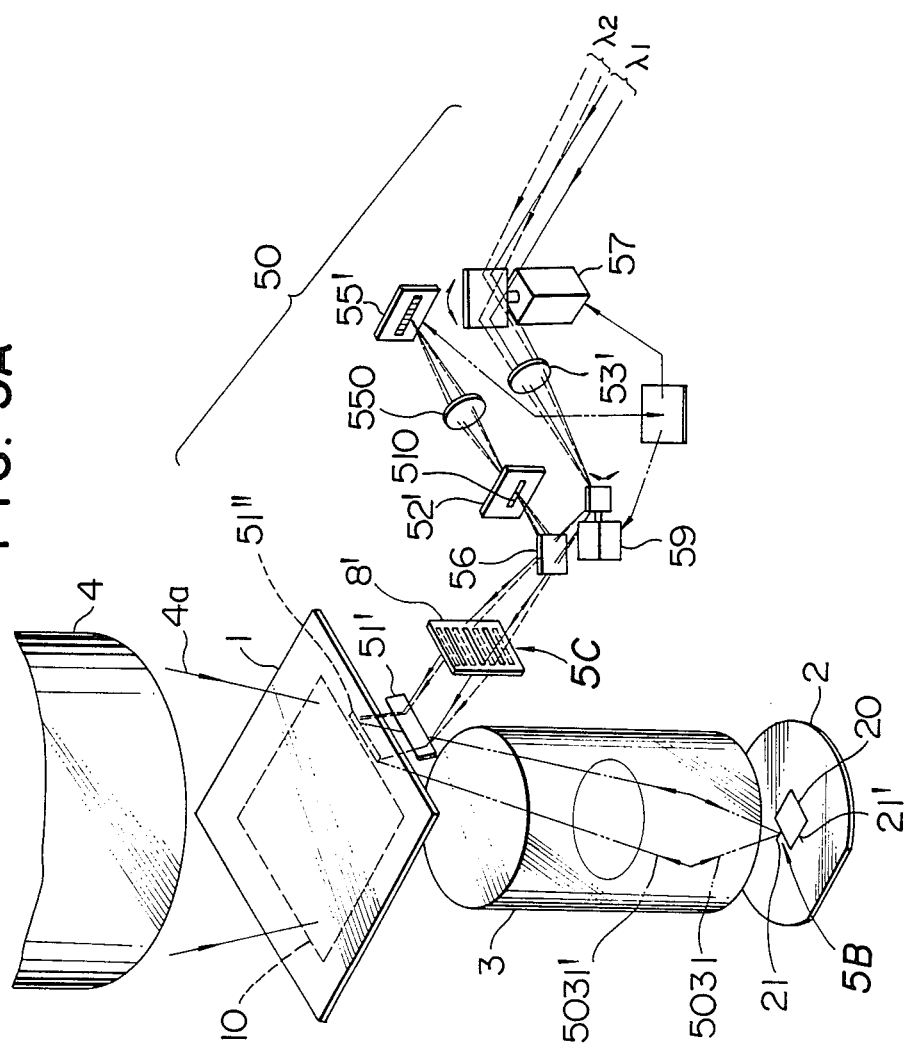

METHOD AND APPARATUS FOR OPTICAL ALIGNMENT OF SEMICONDUCTOR BY USING A HOLOGRAM

BACKGROUND OF THE INVENTION

The present invention relates to method and apparatus for exposing a fine pattern such as a semiconductor to light, and more particularly to method and apparatus of light exposure which uses a short wavelength light for focusing and light exposure, detects an alignment mark on an article to be exposed to the light by a light having a longer wavelength than that of the exposure light through an exposure focusing system.

As a semiconductor circuit was miniaturized, a wavelength of a light used for the light exposure to a circuit pattern has been changed from a g-ray to an i-ray, and a light exposure method which uses an excimer laser beam has been introduced in Proceedings of SPIE-The International Society for Optical Engineering, Volume 633, 1986.

When the excimer laser beam is used, a wavelength thereof is one half of that of a visible band (450 nm ~ 700 nm) and several kinds of glass materials are required for exposing reduction lenses (hereinafter exposure lens and reduction lens are used synonymously). As a result, it is not possible to pay attention to a focusing characteristic to a wavelength other than the exposure light wavelength.

For example, in a reduction lens for a krypton fluoride (KγF) excimer laser (wavelength 248.5 nm), a focusing system comprises quartz glass or a combination of quartz glass and fluorite.

When the above focusing system is used with an alignment light which is a visible light such as argon (Ar) laser (wavelength 515 nm) or helium-neon (He-Ne) laser (543.5 nm, 633 nm), it is difficult to focus an alignment mark on a wafer onto a reticle with a high resolution.

In the prior art apparatus, a focusing system for the registration mark (off-axis alignment system) is used separately from the reduction lens in order to effect alignment.

In the above method, however, it is difficult to maintain an optical center of the reduction lens and the off-axis alignment optical system in a precision of less than an alignment precision (approximately 0.1 μm).

In other prior art light exposure technique, an ultraviolet ray (or far ultraviolet ray) which is the same or close to the wavelength of the exposure light is used together with the reduction lens to effect the alignment.

In this method, however, a depth of focus of the reduction lens is further shortened and it is necessary to form a multi-layer structure or a thick coating in order to make a wafer flat. Accordingly, it is difficult to irradiate an alignment light which has the same wavelength as that of the exposure light onto an alignment mark below a resist layer and detect a reflected light therefrom.

SUMMARY OF THE INVENTION

It is an object of the present invention to provide method and apparatus for optical alignment of a semiconductor, which use the light which has a narrow spectrum band and a high directivity such as visible range or near ultraviolet laser having a high transmissivity to a resist layer, and detect an alignment mark on a wafer through an exposing reduction lens (TTL detection) so that high precision alignment is attained.

The above object is achieved by a method for optical alignment of a semiconductor which irradiates an exposure light to a mark having a fine pattern drawn thereon. When a transmitted light therefrom is directed by an exposure lens as an image of the pattern on a wafer, an alignment mark on the wafer is irradiated by an alignment light having a different wavelength than that of the exposure light. A reflected light therefrom is detected through the exposure lens to detect the position of the alignment mark on the wafer. In order to align the wafer relative to the alignment mark, a hologram is used in at least one of irradiation and detection to compensate for a wavefront aberration of the exposure lens at the alignment wavelength.

A semiconductor exposure apparatus which uses the above method for optical alignment of the semiconductor comprises an exposure light source for illuminating a circuit pattern formed on a mark, an exposure lens for focusing the circuit pattern onto a wafer to be processed, means for irradiating an alignment light having a different wavelength than that of the exposure light source onto an alignment mark on the wafer, alignment detection means for detecting the alignment light irradiated by the alignment irradiation means and reflected by the alignment mark, and a hologram provided in at least one of the alignment irradiation means and the alignment detection means for compensating for a wavefront aberration of the exposure lens at the alignment wavelength.

In the present invention, the hologram is used in at least one of irradiation and detection or the alignment mark on the wafer.

As is well known, the hologram permits recording of not only information relating to an intensity of light after reflection by or transmission through an object but also information relating to a phase (wavefront). Accordingly, by recording the wavefront aberration of the reduction lens at the alignment wavelength into the hologram and compensating for the aberration of the reduction lens at the alignment wavelength by using the hologram, it is possible to irradiate the alignment light to the alignment mark of desired shape and dimension on the wafer through the reduction lens, and the alignment light reflected by the alignment mark can be detected with a high focusing ability.

BRIEF DESCRIPTION OF THE DRAWINGS

FIG. 1A shows an overall construction of one embodiment of an optical aligner for a semiconductor of the present invention, FIG. 1D shows an enlarged perspective view of an illumination light for illuminating a wafer of FIG. 1A, FIG. 5A shows an overall construction of other embodiment of the optical aligner for the semiconductor of the present invention.

DESCRIPTION OF THE PREFERRED EMBODIMENTS

Constructions, concept and functions of the alignment illumination means and detection means of the optical aligner which uses the hologram in accordance with the present invention are explained with reference to FIGS. 15A, 15B and 15C.

Figure 15A:
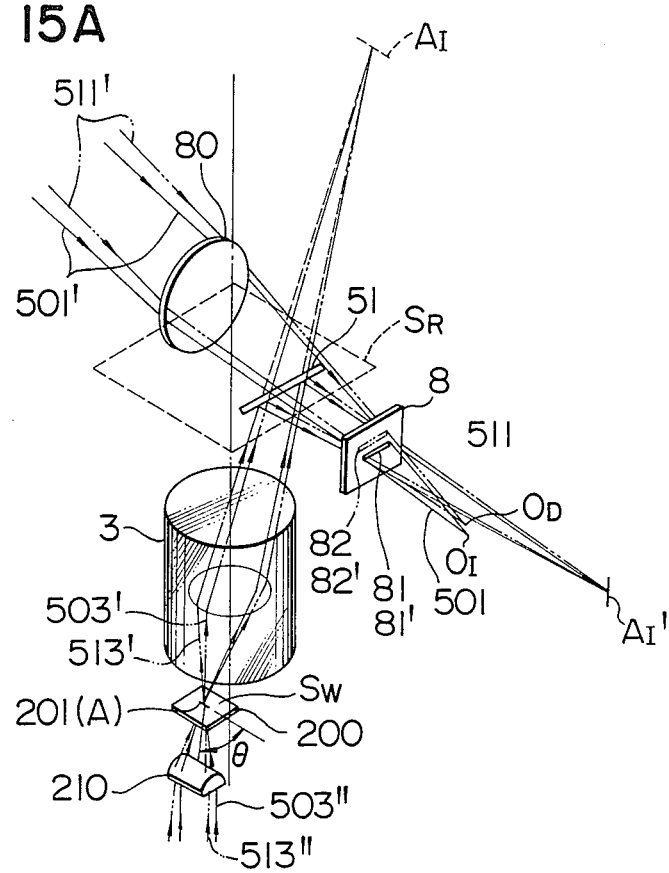
FIG. 15 shows a method for forming an aberration compensation hologram and a method for using the hologram in the present invention.
Figure 15B:
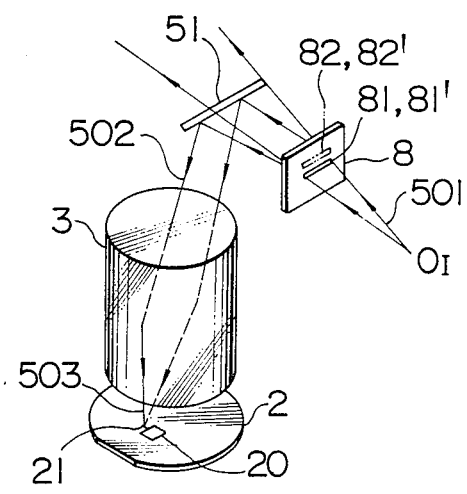

FIG. 15A shows a perspective view illustrating a method for forming a hologram. As shown in FIG. 15A, a reduction lens 3 made of quartz glass has a high resolution focusing relationship between a wafer surface SW and a reticle surface SR for an exposure light (248.5 nm). For an alignment wavelength 515 nm, an image of a slit 201(A) on the wafer surface SW is not formed on the reticle surface SR but it is formed at a position largely spaced from the reticle surface SR. Further, since a resolution of the image of the slit 201(A) is significantly deteriorated, it is almost impossible from a standpoint of precision to detect the wafer image by using the image of the slit to effect the alignment.

As shown in FIG. 15A, a mask 200 is arranged at a position corresponding to the wafer plane SW to the reduction lens 3. The slit 201(A) having a width of approximately 1 μm is formed on the mask 200, and the slit 201(A) is irradiated by a laser beam 503" (or 513") having the same wavelength as the alignment light. (In FIG. 15A, a cylindrical lens 210 is used to efficiently irradiate the laser beam 503" (or 513") to the slit 201(A).)

The laser beam 503" (or 513") of the alignment waveform which has passed through the slit 201(A) is emitted as if there were a light source having the width of 1 μm on the wafer surface SW. When the laser beam 503' (or 513") passes through the reduction lens 3, it does not form the image of the slit 201(A) on the plane SR corresponding to the reticle surface but it forms a defocused image at a position $A_1$ on an extended line. The slit image is not necessarily a real image but it may be a virtual image. The method of the present invention is applicable even in such a situation. The laser beam 503" (or 513") directed to the position $A_1$ is reflected by a mirror or half-mirror 51 to form a mirror image of the position $A_1$ at a position $A_1'$. A hologram recording medium 8 is arranged in a light path of the reflected light and a reference light 501' is superimposed to a position 81' through which the laser beam 503' (or 513') reflected by the recording medium 8 passes to record a hologram interference fringe onto the hologram recording medium 8.

As shown in FIG. 15A, the reference beam 501' is formed by using a focusing lens 80 so that the laser beam 503' (or 513') is focused at a point O$_1$. The first hologram 81 formed at a position 81 through which the reflected laser beam 503' (or 513') passes is formed by using the laser beam 503" (or 513") as an object light, whose primary light beam is normal to the slit 201. Accordingly, the object light used to form the first hologram 81 is perfectly reproduced by reproducing the first hologram 81 by the reproducing light which is focused at the point O$_1$ (emitted from the point O$_1$) as shown in FIG. 15B. By back-tracing the mirror 51 and the reduction lens 3, the reproducing (diffraction) light of the first hologram 81 forms an aperture image of the slit 201 having the width of 1 μm at the position corresponding to the position of the slit 201 as shown in FIG. 15A. The width W of the aperture image is W=d if d≧d', and W=d' if d<d' for a resolution attainable by a theoretical perfect lens, that is, a resolution width d'=0.6 λ/NA, where d is a slit width used to form the hologram, NA is a number of aperture of the reduction lens and λ is an alignment wavelength. Thus, the hologram reproduced light can illuminate in a narrow slit of a resolution width at a limit of diffraction determined by the number of aperture of the exposure lens and the wavelength. Accordingly, when the alignment mark 21 on the wafer is moved to the position corresponding to the position of the slit 201, it is possible to illuminate the alignment mark 21 in a very limited area as shown in FIG. 15B.

A second hologram 82 is recorded on the hologram recording medium 8. The second hologram 82 is formed in the following manner.

In FIG. 15A, the illumination light 503" to the slit 201 is emitted with a primary optical axis thereof being directed at an incident angle θ to the slit surface SW. The transmitted light 503' (or 513') from the slit 201 passes through the reduction lens 3 and the mirror 51 and is directed to the position 82' of the hologram recording medium 8 where it is superimposed to form an interference fringe with the reference light 511' focused at the point O$_D$. In this manner, the second hologram 82 is formed at the position 82'.

Figure 15C:
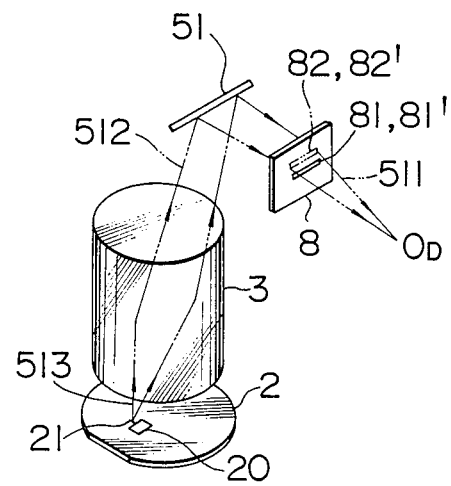

The second hologram 82 is used to detect the diffracted light (diffraction angle θ) from the alignment mark 21 (periodic structure as shown in FIG. 1D) on the wafer as shown in FIG. 15C.

A method for detecting the diffracted light from the alignment mark 21 by using the hologram is explained below.

As described above, the laser illumination light 503 (see FIG. 15B) to the alignment mark 21 on the wafer is formed by the first hologram 81, and the wafer illumination light 502 generated by the first hologram 81 illuminates the wafer 2 normally to the plane of the alignment mark 21 of the wafer 2. As a result, the diffraction angle θ from the alignment mark 21 having the periodic structure (pitch ρ) reflects at $$= \sin \frac{-1\lambda}{\rho}$$

and the detection light 502 transmitted through the reduction lens 3 and the mirror 51 is directed to the second hologram 82. Thus, the diffracted light 511 from the second hologram 82 is focused at the focusing point O$_D$ of the reference light 511' used to form the second hologram 82, as shown in FIG. 15C.

Accordingly, the alignment mark 21 can be detected by arranging the detector (not shown) at the focusing point O$_D$.

One embodiment of the present invention is now explained with reference to FIGS. 1A to 1D.

In FIGS. 1A to 1D, numeral 1 denotes a reticle (mask), numeral 10 denotes a master pattern of a circuit pattern, numeral 2 denotes a wafer, numeral 20 denotes a field which is exposed to light at one time and which contains one to several chips, and numeral 21 denotes an alignment mark of the wafer 2. The master pattern 10 of the circuit pattern on the reticle 1 is reduced by a reduction lens 3 and focused onto the field 20 on the wafer 2 by an exposure light (not shown). Numeral 4 denotes an exposure light source. When an excimer laser beam 4a emitted from an excimer laser light source (not shown) is directed to the reticle 1 with desired directivity and intensity uniformity, one to several chips of circuit pattern of the master pattern 10 on the reticle 1 is exposed and transferred onto the wafer 2 by the excimer laser beam 4a. The alignment mark 21 has an x-axis alignment mark 21x a y-axis alignment mark 21y for each exposure field 20 on the wafer 2. In the present embodiment, the alignment marks 21x and 21y are detected by separate detection optical systems, although only an x-axis detection optical system 50 is shown. The x-axis detection optical system 50 directs the alignment laser beam 501 to the alignment mark 21 on the wafer and detects the reflected light 503 (or 513) and it comprises a mirror 51. A hologram 8, an apertured mirror 52, condenser lenses 53 and 54 and a photo-detector 55.

A detection method by the detection optical system 50 is now explained.

The laser beam 501 emitted from the alignment laser light source (not shown) is focused to the aperture 521 of the apertured mirror 52 by the condenser lens 53, and the scattering laser beam 501 transmitted through the aperture 521 is directed to the first hologram 81 recorded on the hologram recording medium 8. As shown in FIG. 15B, the diffracted light 502 from the first hologram 81 passes through the mirror 51 and the reduction lens 3 and the light 503 in a slit shape having a width of approximately 1 μm is irradiated onto the wafer 2. As shown in an enlarged view of FIG. 1D, the alignment mark 21 of the periodic structure having a plurality of recessed patterns 210 arranged at a pitch ρ is recorded on the wafer 2. Thus, as the wafer is moved in a direction E so that the slit illumination light 503 illuminates the alignment mark 21, a 0-order normal reflected light as well as ±1-order, ±2-order, . . . diffracted lights are generated. The ±1-order reflected lights are directed to the reduction lens 3 at a refection angle θ defined below.

$$\sin\theta = \frac{\lambda}{\rho} \quad (1)$$

where λ is the wavelength of the alignment light.

Figure 1B:
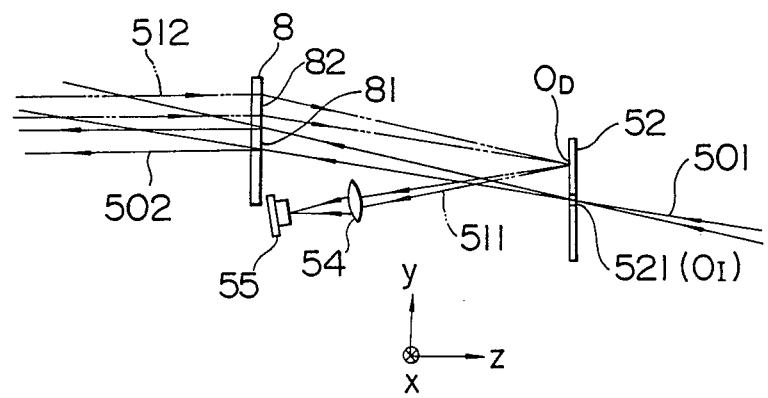
FIG. 1B shows a detection optical system of FIG. 1A.
Figure 1C:
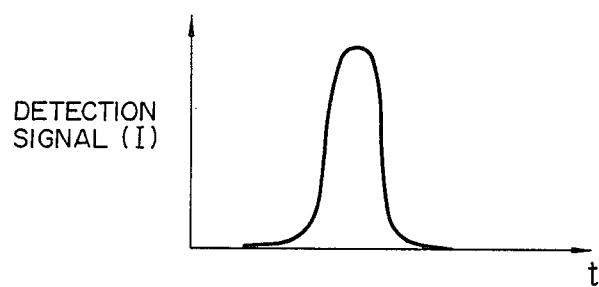
FIG. 1C shows a detection signal waveform detected by a detector of FIG. 1A.

The ±1-order diffracted lights pass through the reduction lens 3, are reflected by the mirror 51 and directed to the second hologram 82 recorded on the hologram recording medium 8. As shown in FIG. 15C, the second hologram 82 is formed by illuminating the slit 20 arranged at the position corresponding to the surface of the wafer 2 at the incident angle θ. As a result, when the laser beam 512 diffracted by the alignment mark 21 at the diffraction angle θ is directed to the second hologram 82, the diffracted light (reproduced light) 511 from the second hologram 82 is focused at the position corresponding to the position of $O_D$ shown in FIG. 15C. On the other hand, the reflected light 503 from the wafer 2 illuminates the second hologram 82 and the 0-order light which is not diffracted but transmitted as it is passes through the aperture 521 of the apertured mirror 52. The 1-order diffracted light 511 from the first hologram 81 is reflected at a position $O_D$ on the wall other than the aperture 521 of the apertured mirror 52, and focused to the photo-detector 55 by the condenser lens 54. When the diffracted light 511 is focused to the photo-detector 55, it produces a detection signal (I) as shown in FIG. 1C. Thus, if a center position of the detection signal and information on the position of the wafer 2 when the center position is detected are determined, the x-axis position of the alignment mark 21 can be determined. In a similar manner, the y-axis position of the alignment mark 21 can be determined by a y-axis detection optical system (not shown). By aligning the wafer 2 relative to the reticle 1 by a wafer coarse drive mechanism and a wafer or reticle fine drive mechanism in accordance with the position information of the alignment mark 21 which indicate the x-axis and y-axis positions, the master pattern 10 of the circuit pattern of the reticle 1 can be precisely overexposed on the wafer 2.

In FIG. 1A, the second hologram 82 is used although it is not necessarily be used. In this case, the 1-order diffracted light or the ±1-order diffracted lights from the alignment mark 21 are directly detected.

Another embodiment of the present invention is explained with reference to FIGS. 2A and 2B. n FIGS. 2A and 2B, the like elements to those shown in FIGS. 1A to 1D are designated by the like numerals.

Figure 2A:
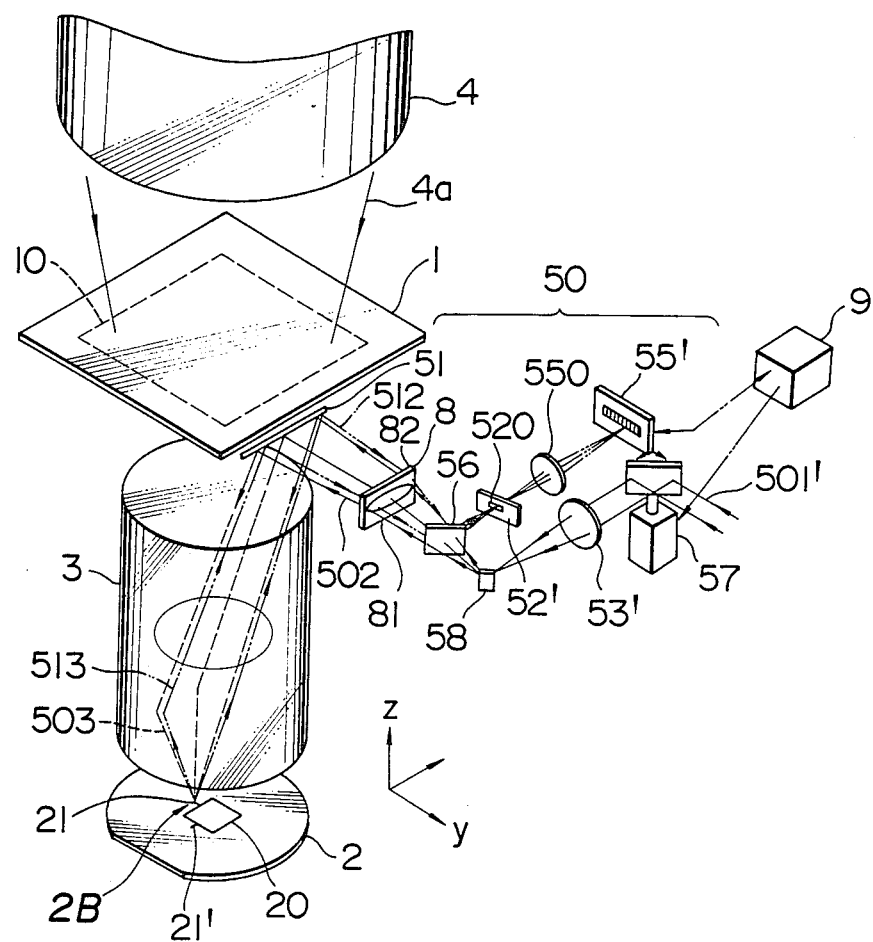
FIG. 2A shows an overall construction of another embodiment of the optical aligner for the semiconductor of the present invention.
Figure 2B:
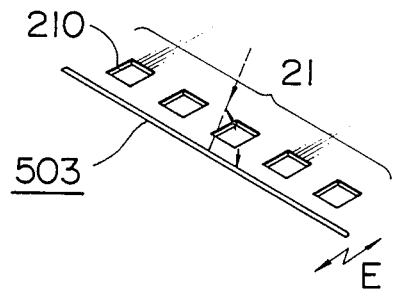
FIG. 2B shows an enlarged perspective view of an illumination light for illuminating a wafer of FIG. 2A.

In FIGS. 2A and 2B, the slit laser beam 503 for illuminating the alignment mark 21 on the wafer 2 is directed normally to the plane of the alignment mark 21 of the wafer 2 as is done in FIG. 1. The wafer 2 is fixed and the slit laser beam 503 is scanned in the direction E shown in FIG. 2B. The scan of the slit laser beam 503 is attained by deflecting the illumination laser beam 501' by light deflection means. In the following description, a Galvano-mirror is used as the light deflection means. As the Galvano-mirror 57 is slightly deflected around a z-axis, the position at which the light is focused by the condenser lens 53' is slightly displaced along the y-axis. As a result, the incident angle of the hologram illumination light 501' is slightly changed and the diffracted light 503 from the first hologram 81 forms the slit beam 503 on the wafer 2. It is moved along the x-axis in synchronism with the deflection of the Galvano-mirror 57. Since the illumination position on the alignment mark 21 which comprises the periodic pattern 210 is moved while the diffracted light 503 is directed normally thereto, the reflected and diffracted light 513 from the alignment mark 21 which has passed through the reduction lens 3 illuminates the second hologram 82 with a slightly varying incident angle. Accordingly, the 1-order diffracted light 512 reproduced by the second hologram 82 is reflected by the beam splitter 56 and passes through the aperture 520 of the apertured mirror 52'. On the other hand, the normal reflected light from the periodic pattern 210 is directed to the first hologram 81, and the 0-order light and 1-order light are blocked by the position $O_D$ on the wall of the mirror 52' where the aperture 520 of the mirror 52' is not formed. The 1-order diffracted light from the periodic pattern 210 is directed to the second hologram 82 and blocked by the position $O_D$ on the wall of the mirror 52' where the aperture 520 is not formed. As a result, only the diffracted light from the desired periodic pattern 210 passes through the aperture 520 of the mirror 52'. The diffracted light 512 from the desired periodic pattern 210 is focused in the vicinity of the aperture 521. Since the incident angle to the second hologram 82 changes, the focus position varies with the movement of the illumination position of the laser beam 4a to the wafer 2. The diffracted light 512 transmitted through the aperture 520 is focused onto a one-dimension sensor 55' by the focusing lens 550. Accordingly, the image of the alignment mark 21 (image by the 1-order diffracted light) is produced as a signal by deflecting the Galvano-mirror 57 by the drive control circuit 9, reading the image information from the one-dimension sensor 55' and reading the information of the one-dimension sensor 55' after the deflection.

Other embodiment of the present invention is explained with reference to FIGS. 3A and 3B. The like elements to those shown in FIGS. 2A and 2B are designated by the like numerals.

Figure 3A:
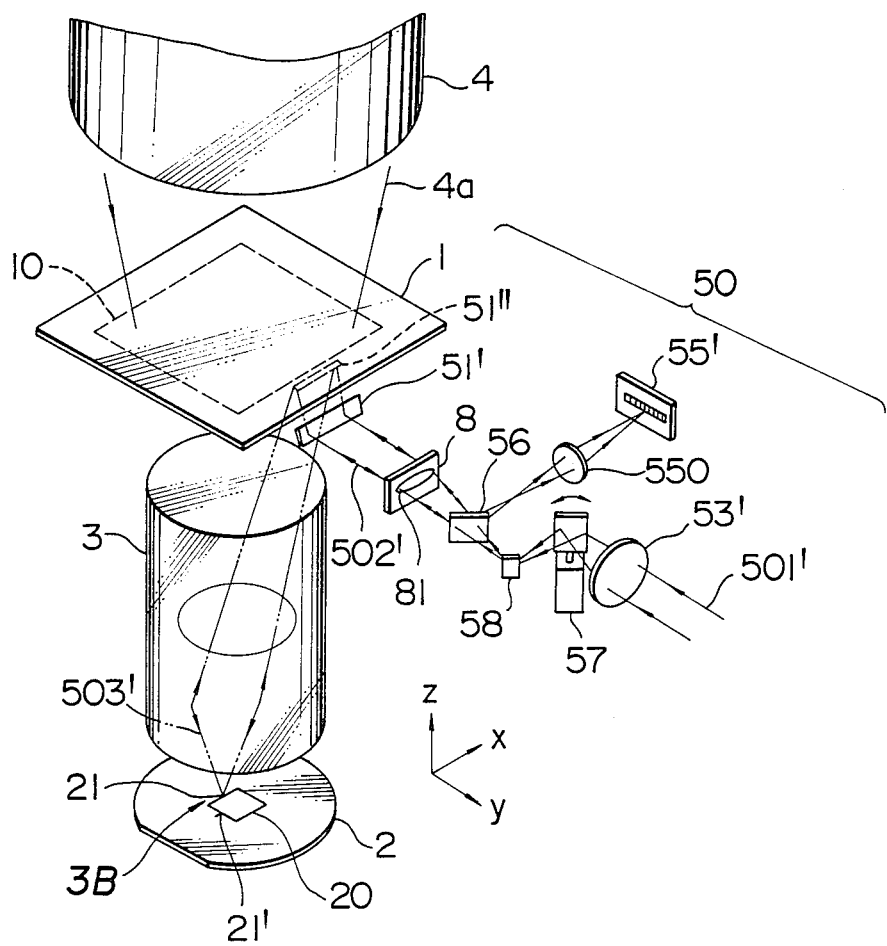
FIG. 3A shows an overall construction of other embodiment of the optical aligner for the semiconductor of the present invention.
Figure 3B:
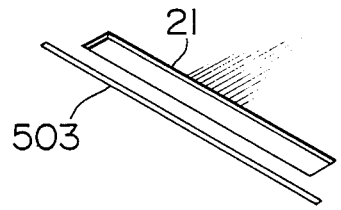
FIG. 3B shows an enlarged perspective view of an illumination light for illuminating a wafer of FIG. 3A.

In FIG. 3A, the alignment mark 21 is of bar shape as shown in FIG. 3B. A chromium film (or chromium oxide film) formed on a periphery of the master pattern 10 of the circuit pattern of the reticle 1 is used as a mirror 51". The illumination light 501' deflected by the Galvano-mirror 57 illuminates the hologram 81, and the diffracted light 502' thereof is reflected by the mirror 51' and the reticle mirror 51", passes through the reduction lens 3 and is directed to the bar alignment mark 21 normally thereto at a varying position. The light reflected by the bar alignment mark 21 again passes through the reduction lens 3, is reflected by the mirrors 51" and 51' on the reticle 1, and again directed to the first hologram 81. The light 503' transmitted through and diffracted by the first hologram 81 is reflected by the beam splitter 56 and directed to one point. This point is focused onto the one-dimension sensor 55' by the focusing lens 550. As a result, the illumination position to the alignment mark 21 on the wafer 2 is varied by the deflection of the Galvano-mirror 57, and the position at which the diffracted light 502' transmitted through the first hologram 81 and reflected by the beam splitter 56 is focused also varies, and the image of the alignment mark 21 is detected by the one-dimension sensor 55'. Accordingly, in the present embodiment, the first hologram 81 is used for the illumination and detection and the Galvano-mirror 57 and the one-dimension sensor 55' are driven at the same timing as that of the previous embodiment so that the image of the alignment mark 21 (image by the 1-order diffracted light) is produced as the signal.

Figure 4A:
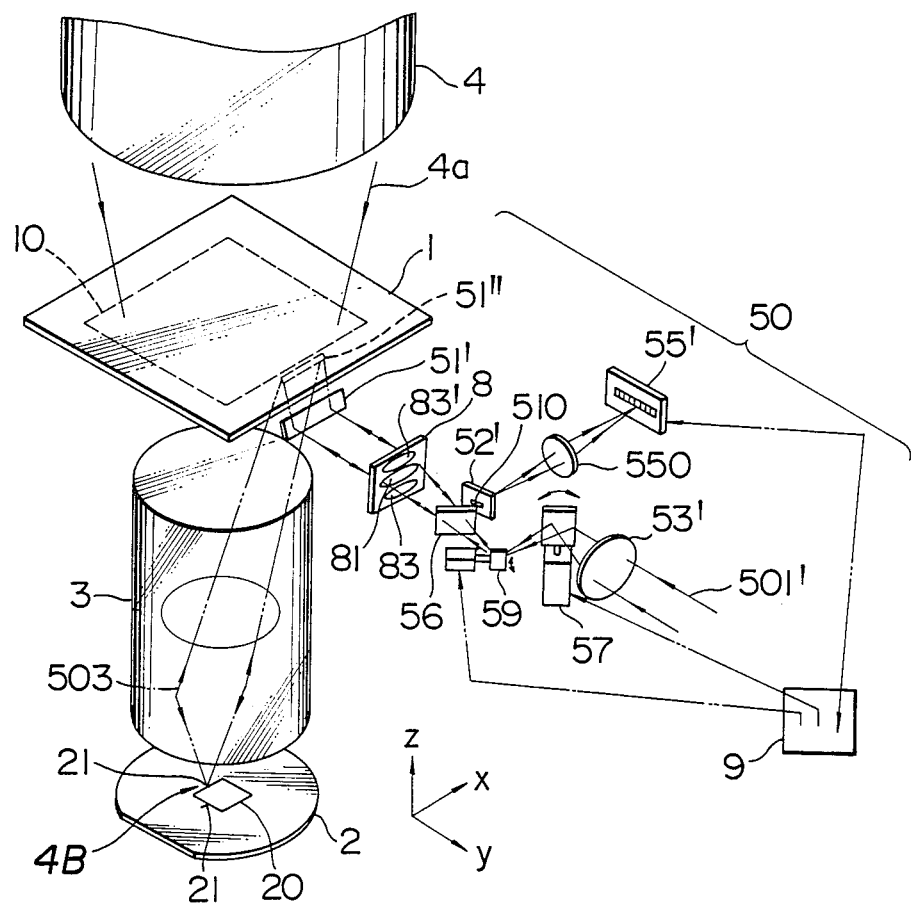
FIG. 4A shows an overall construction of other embodiment of the optical aligner for the semiconductor of the present invention.
Figure 4B:
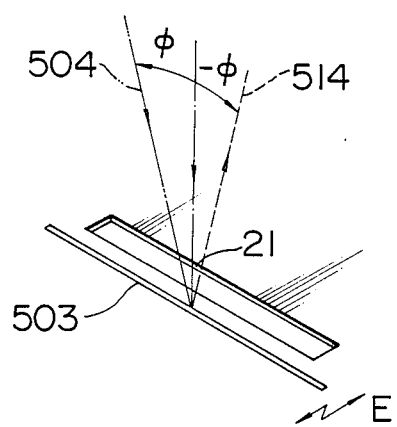
FIG. 4B shows an enlarged perspective view of an illumination light for illuminating a wafer of FIG. 4A.

Other embodiment of the present invention is explained with reference to FIGS. 4A and 4B. The like elements to those shown in FIGS. 2A and 3 are designated by the like numerals.

Figure 11A:
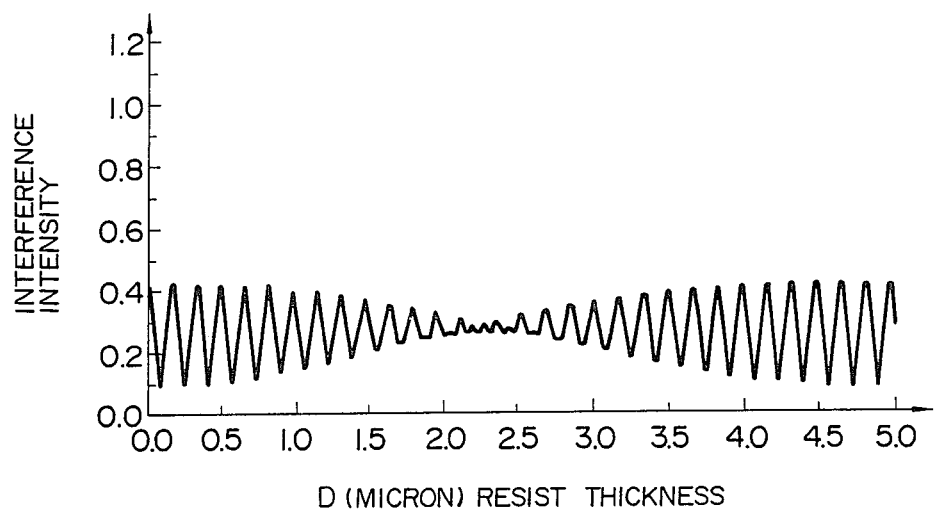
FIG. 11A shows a relationship between a thickness of a resist layer and an interference strength in one embodiment of 2-wavelength and 2-angle illumination of the present invention.
Figure 11B:
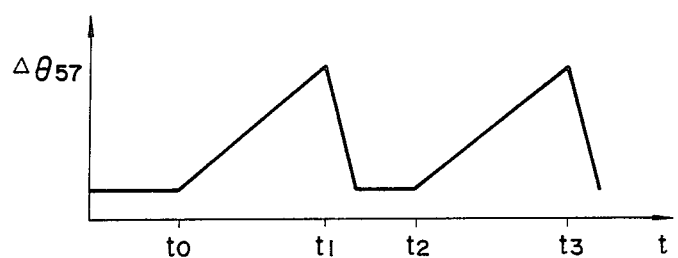
FIG. 11B shows a galvano-mirror drive timing chart in the embodiment of the 2-wavelength and 2-angle illumination of the present invention.
Figure 11C:
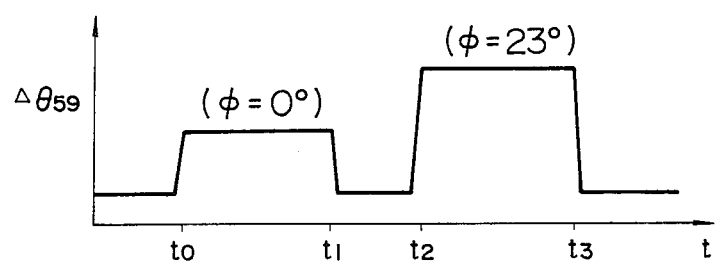
FIG. 11C shows a relationship between a polarization angle and a time sequence in the embodiment of the 2-wavelength and 2-angle illumination of the present invention.

In the present embodiment, three holograms 81, 83 and 83' are recorded on the hologram recording medium 8. The first hologram 81 has the same function as that of the first hologram 81 shown in FIG. 3 and it is used to illuminate the bar alignment mark 21 normally and detect the reflected light therefrom. The second hologram 83 is used to illuminate the bar alignment mark 21 at an incident angle $\phi$ as shown in FIG. 4B. (The incident light 504 is in the plane of the y-axis and z-axis.) As shown in FIG. 4B, the illumination light 504 directed to the wafer at the incident angle $\phi$ is reflected by the bar alignment mark 21 at the reflection angle $-\phi$. The reflected light 514 is directed to the third hologram 83' by which it is diffracted. Then, it is reflected by the beam splitter 56, passes through the aperture 510 of the mirror 52' and is focused onto the one-dimension sensor 55'. When it is directed normally to the alignment mark 21 on the wafer 2, it is focused onto the one-dimension sensor 55' through the aperture 510 of the mirror 52' like the case shown in FIG. 4A. Switching between the downward illumination normal to the wafer 2 and the downward illumination at the angle of inclination $\phi$ is effected by deflecting the Galvano-mirror 59 by the drive signal from the drive control circuit 9. The alignment mark 21 on the wafer 2 is illuminated normally thereto or at the angle of inclination, and the reflected light 514 therefrom is focused by the one-dimension sensor 55' and the detected signals are added. Thus, the asymmetricity of the detection signal waveform for the inclined incident angle due to the ununiformity of application of the resist layer in the vicinity of the alignment mark 21 is substantially reduced by the signal for the normal incident light. The effect of the two-angle illumination to the ununiformity of application of the resist layer is described in JP-A-No. 62-200743 (referenced not as prior art but for explanation) filed by the present assignee. The adoption of the two-angle illumination in effect corresponds to the detection by two wavelengths, and a variation in intensity of interresist interference is smaller than that of one-angle illumination (one incident angle) and the affect by the change in the thickness of the resist layer is reduced. This is discussed below in further detail. FIG. 11A shows a thickness of the resist layer 1 versus an interference when the wavelength is 0.515 nm, the detection number of aperture (NA) is 0.42 and the illumination angles are 0° and 23°. As seen from FIG. 11A, in a region where the interference intensity does not change significantly with the change in the thickness of the resist layer 1, the affect by the ununiformity of application of the resist layer is low. Particularly when the thickness of the resist layer 1 is between 1.5 $\mu$m and 3.0 $\mu$m, the effect of the two-angle illumination is remarkable. As the detection NA increases as the exposure pattern is more miniturized, it is possible to increase the incident angle $\phi$ of the angled illumination. This is advantageous in eliminating the affect by the ununiformity of the application. FIG. 11B shows a drive timing chart for the two Galvano-mirrors 57 and 59, that is, changes in time of deflection angles $\Delta\theta 57$ and $\Delta\theta 59$. As shown in FIG. 11C, in a time period $t_0$ to $t_1$, the normal illumination (angle $\phi$ is 0°) is used, and in a time period $t_2$ to $t_3$, the angled illumination (angle $\phi$ is 23°) is used. As shown in FIGS. 11B and 11C, the detected images for the illuminations at the angles $\phi = 0$ and $\phi = 23°$ in the time period $t_0$ to $t_3$ are summed so that the relationship shown in FIG. 11A is met for the change in the thickness of the resist 1.

Other embodiment of the present invention is explained with reference to FIGS. 5A, 5B and 5C. The like elements to those shown in FIGS. 3 and 4A are designated by the like numerals.

In FIG. 5A, two laser beams 5031 and 5031' having different wavelengths $\lambda_1$ and $\lambda_2$, respectively, are used to detect the alignment mark 21 on the wafer 2. As shown in FIG. 5C, holograms 821, 822 and 822' for the wavelength $\lambda_1$ and holograms 831, 831', 832 and 832' for the wavelength $\lambda_2$ are recorded on the hologram recording medium 8. Of those holograms 821, 822 and 822' for the wavelength $\lambda_1$ and holograms 831, 831', 832 and 832' for the wavelength $\lambda_2$, the holograms 821 and 822 for the wavelength $\lambda_1$ and the holograms 831 and 832 for the wavelength $\lambda_2$ are used for illumination, and the hologram 822' for the wavelength $\lambda_1$ and the hologram 832' for the wavelength $\lambda_2$ are used for detection. The hologram 821 for the wavelength $\lambda_1$ is used for illumination and detection. Those seven holograms for the different wavelengths are formed by methods shown in FIGS. 6A and 6B. FIG. 15A shows the method for forming the hologram and the method for using the same for illumination and detection. In FIGS. 6A and 6B, the holograms 821, 822, 822', 831, 831', 832 and 832' are formed for the wavelength $\lambda_1$ of solid line lights 521, 522 and 522' and the wavelength $\lambda_2$ of broken line lights 531, 531', 532 and 532'. At a wavelength other than that of the exposure light 4a of the reduction lens 3, the image of the alignment mark on the wafer 2 (corresponding to the slit 201 in FIG. 6A) is formed at different position such as $A_{f1}$ or $A_{f2}$ as the wavelength $\lambda$ changes. Those images are reflected by the mirror 51 and focused at $A_{rl}$ and $A_{r2}$. Accordingly, by arranging the hologram recording medium 8 in the light paths of the lights 521, 522, 522', 531, 531', 532 and 532', the reference light 501 having the wavelength $\lambda_1$ and the reference light 511 having the wavelength $\lambda_2$ are superimposed on the hologram recording medium 8 to form the holograms 821, 822, 822', 831, 831', 832 and 832'. The object light shown in FIG. 6A is a light transmitted through the slit 201, which is generated by illuminating the slit 201 by the light 521 having the waveform $\lambda_1$ or the light 531 having the wavelength $\lambda_2$ as shown in FIG. 6B. In addition to the hologram 821 for the wavelength $\lambda_1$ or the hologram 831 for the wavelength $\lambda_2$ formed for the object light, the incident angle $\phi$ to the slit 201 is changed as shown in FIG. 6B. The lights 522, 522', 531' and the light 532 and 532' are formed for the wavelengths $\lambda_1$ and $\lambda_2$, respectively, and those lights 522, 522', 531', 532 and 532' are directed to the slit 201 and the transmitted light therefrom is used as the object light to form the holograms 822, 822', 831, 832 and 832'. The reference lights 501 and 511 focused at the position $O_1$ are used as the reference lights, as they are used when the holograms 821 and 831 are formed. If the reference lights 501 and 511 are directed to other areas than the holograms 822, 822', 831', 832 and 832' to be formed, fogging occurs and this lowers the diffraction efficiency of the other holograms 821 and 831. Accordingly, a mask (not shown) to prevent fogging exposure to the areas other than the desired areas is arranged to face the reticle 1 in the vicinity of the hologram recording medium 8.

Figure 5B:
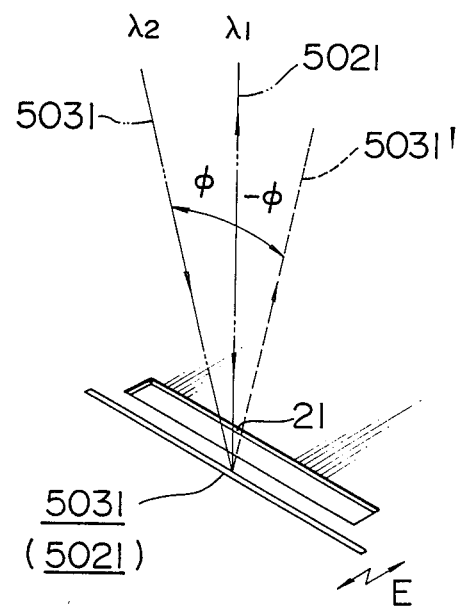
FIG. 5B shows an enlarged perspective view of an illumination light for illuminating a wafer of FIG. 5A.
Figure 5C:
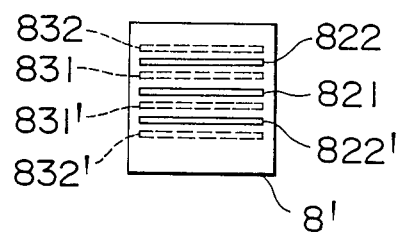
FIG. 5C shows a hologram recording medium.
Figure 6A:
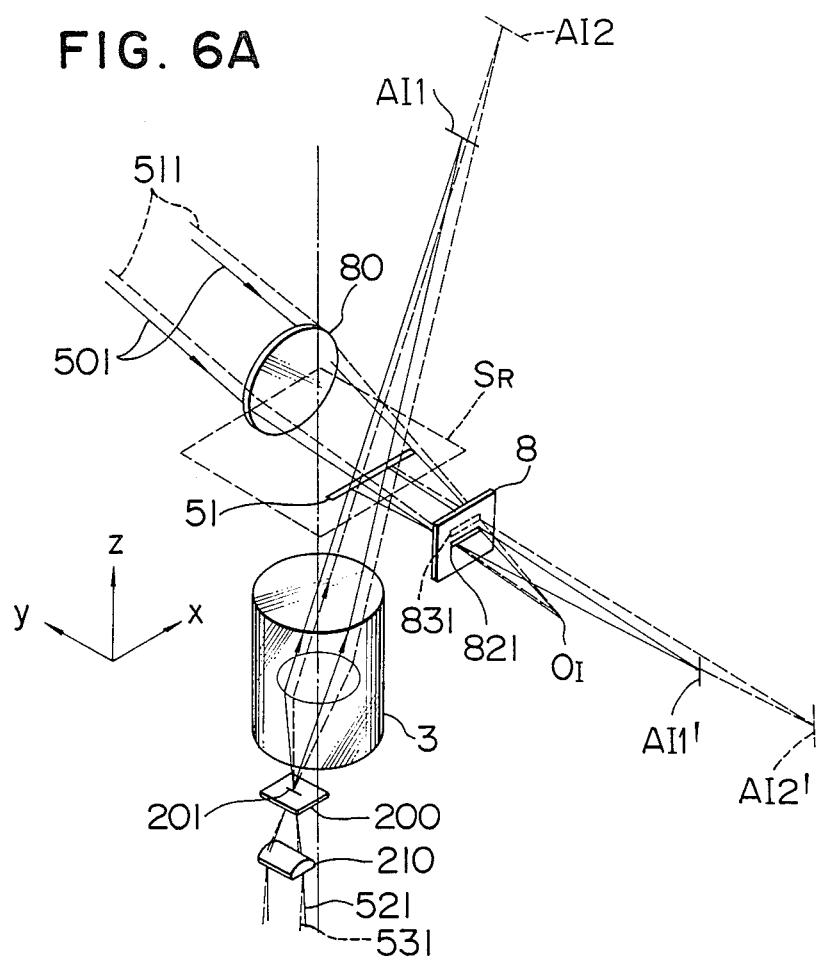
FIG. 6A illustrates a method for forming the hologram shown in FIG. 5A.
Figure 6B:
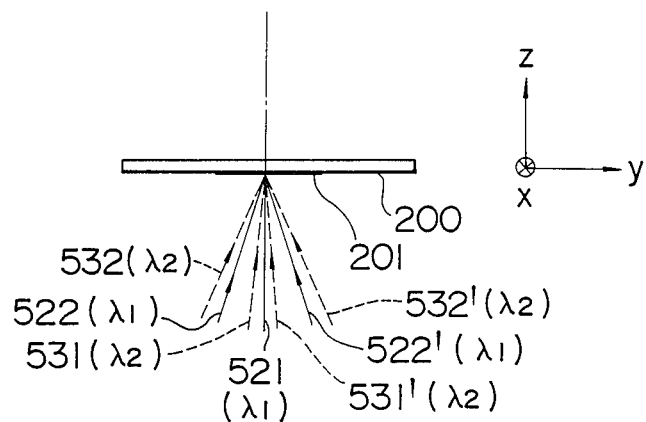
FIG. 6B shows an illumination light for illuminating a slit of FIG. 6A.

The holograms 821, 822, 822', 831, 831', 832 and 832' thus formed are arranged in the reducing exposure apparatus as shown in FIGS. 5A and 5B and the reproducing laser beam is directed to those holograms 821, 822, 822', 831, 831', 832 and 832'. As the reproducing laser beam is deflected by the Galvano-mirror 57, the illumination beam 5031 is scanned on the alignment mark 21 on the wafer 2 in the direction E shown in FIG. 5B as explained before. Accordingly, the laser beam 5031' reflected by the wafer 2 is detected by the same hologram 821 as that used for the illumination if the angle is 0°, and detected by the hologram which is at a symmetric position with respect to the hologram 821, for example, the hologram 831' when the hologram 831 is used for the illumination, if the angle is larger than 0°. Accordingly, by forming the holograms under the condition shown in Table 1, the asymmeticicity of the detection waveform to the ununiformity of the application of the resist layer is reduced as described in JP-A-No. 62-200743 (referenced not as prior art but for explanation) mentioned above. Accordingly, the detection of the alignment mark 21 with a small detection error is attained.

TABLE 1

| | Condition for 2-Wavelength Detection | |
|---|---|---|
| Hologram Used | Wavelength | Incident (or Reflection) Angle |
| 821 | λ1 | 0° |
| 822(822') | λ1 | 20° (−20°) |
| 831(831') | λ1 | 3° (−3°) |
| 832(832') | λ2 | 23° (−23°) |

The Galvano-mirror 59 of FIG. 5A is the second Galvano-mirror, which directs the lights having the wavelengths $\lambda_1$ and $\lambda_2$ simultaneously to the hologram and changes the incident angle to the wafer as the Galvano-mirror 59 is deflected. The holograms 821 and 831 are simultaneously illuminated by the lasers having the wavelengths $\lambda_1$ and $\lambda_2$ by one deflection angle of the Galvano-mirror 59, and the holograms 822 and 832 are simultaneously illuminated by the lasers having the wavelengths $\lambda_1$ and $\lambda_2$ by changing the deflection angle of the Galvano-mirror 59. In this manner, the signals detected at two incident angles for two wavelengths ($\lambda_1$, $\lambda_2$) are combined and the center position of the combined waveform is determined.

A method for detecting the alignment mark in accordance with the present invention is now explained in further detail.

Figure 12A:
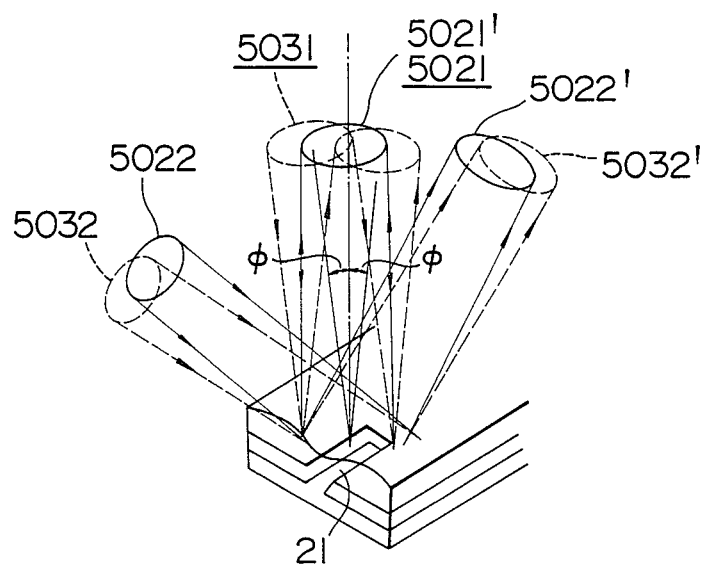
FIG. 12A illustrates irradiation and reflection of an illumination light to and by an alignment mark on a wafer in other embodiment of the 2-wavelength and 2-angle illumination of the present invention.
Figure 12B:
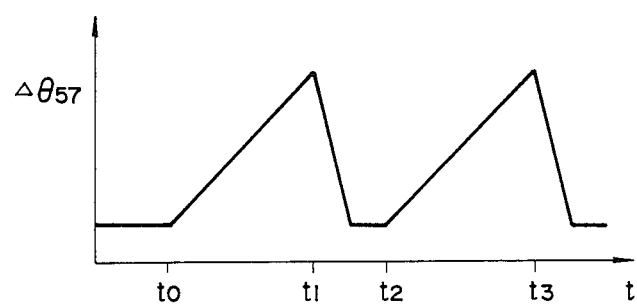
FIG. 12B shows a galvano-mirror drive timing chart in the other embodiment of the 2-wavelength and 2-angle illumination of the present invention.
Figure 12C:
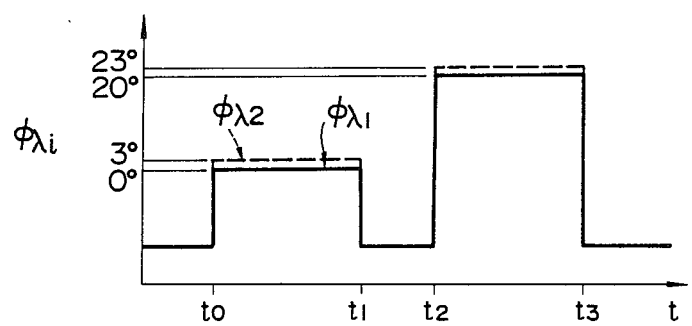
FIG. 12C shows a timing chart of the 2-wavelength and 2-angle illumination in the other embodiment of the 2-wavelength and 2-angle illumination of the present invention.
Figure 13:
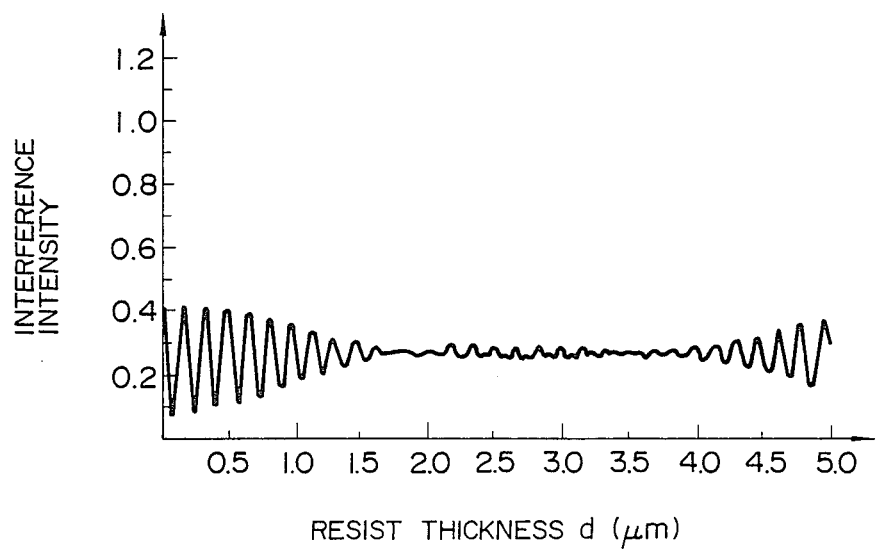
FIG. 13 shows a relationship between a thickness of a resist layer and an interference strength in FIG. 12, FIGS. 14A to 14C illustrate reduction of asymmetricity of a detection pattern detected by application of the resist layer near an edge of an alignment mark.
Figure 14A:
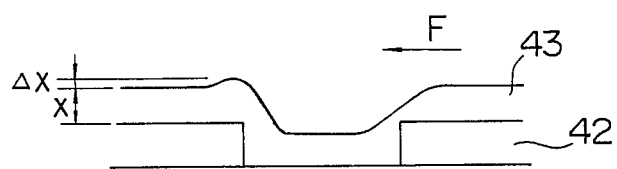
FIG. 14A shows ununiformity in application of the resist layer.
Figure 14B:
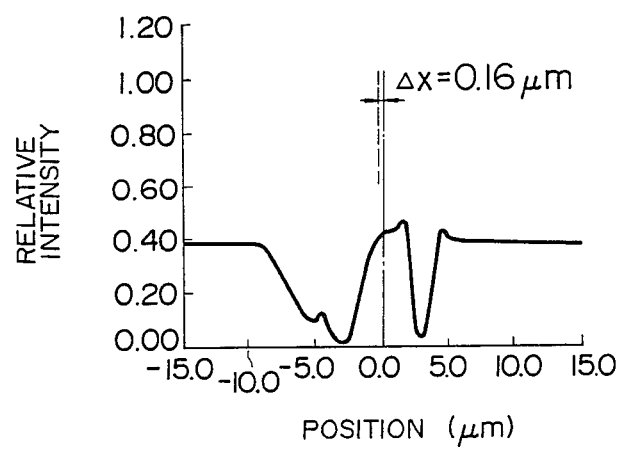
FIG. 14B shows a waveform of a simple 2-wavelength detection pattern.
Figure 14C:
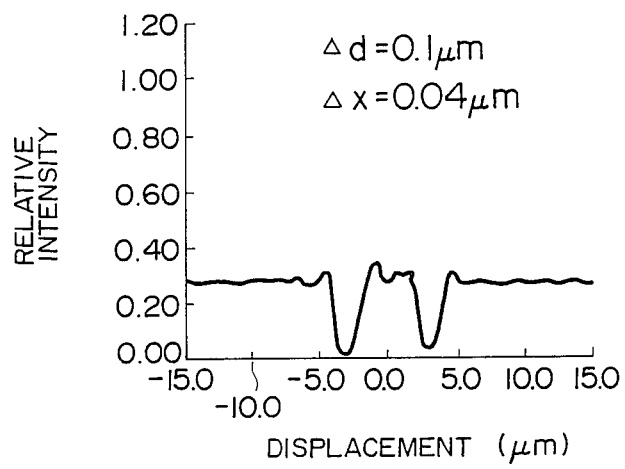
FIG. 14C shows a waveform of a 2-wavelength detection pattern of the present invention.

FIGS. 12A, 12B and 12C show a change in time of the deflection angles of the two Galvano-mirrors, the incident light to the alignment mark and the reflected light from the alignment mark. The drives of the two Galvano-mirrors and the detector are controlled by the drive control circuit (FIGS. 2A and 4A). As shown in FIG. 12C, during a time period $t_0$ to $t_1$, the lights having the waveforms $\lambda_1$ and $\lambda_2$ are directed to the alignment mark 21 at incident angles $\phi\lambda_1=0°$ and $\phi\lambda_2=3°$. The incident angle 3° is angled by 3° with respect to a normal line in a longitudinal direction of the alignment mark 21. The Galvano-mirror 57 of FIG. 5A is slightly deflected while the two wavelengths $\lambda_1$ and $\lambda_2$ are directed ($t_0 \sim t_1$), and the slit illumination lights 5031 and 5021 drive the alignment mark 21 in the detection direction (arrow in FIG. 5A). As described above, the reflected lights 5021' and 5031' from the alignment mark 21 having the wavelengths $\lambda_1$ and $\lambda_2$ are focused onto the linear sensor 55', and the focusing positions on the linear sensor 55' vary with the scan of the slit illumination lights 5031 and 5021. Accordingly, at the end of the scan of the Galvano-mirror 57 in the time period of $t_0 \sim t_1$, the image of the alignment mark 21 has been stored in the linear sensor 55' and the image stored in the time period of $t_1 \sim t_2$ is read. Next, the Galvano-mirror 59 of FIG. 5A is deflected by a predetermined angle for a time period $t_2 \sim t_3$ to simultaneously illuminate the holograms 822 and 832. Thus, as shown in FIG. 12A, the laser beam 5022 having the waveform $\lambda_1$ is directed to the alignment mark 21 at the incident angle 20°, and the laser beam 5032 having the waveform $\lambda_2$ is directed at the incident angle 20° so that the detection waveforms for both wavelengths $\lambda_1$ and $\lambda_2$ are produced. A combined detection strength of four waveforms resulting from the irradiation of the two wavelengths $\lambda_1$ and $\lambda_2$ to the alignment mark 21 at the two incident angles 0° and 3° varies with the thickness (d) of the resist layer 1 as shown in FIG. 13. In the present embodiment, $\lambda_1=514.5$ nm and $\lambda_2=543.5$ nm. As seen from FIG. 13, in the present embodiment, the interference intensity variation is small in a range of the thickness d of the resist layer 1 of $1 \sim 4.5$ μm, and the interference intensity variation in the range of the thickness d of the resist layer 1 of $1.5 \sim 4$ μm is less than 1/5 of the maximum interference intensity variation. As a result, the asymmetricity of the detection pattern due to the ununiformity of the application of the resist layer 1 near the edge of the alignment mark 21 can be significantly reduced. FIGS. 14A~14C illustrate the reduction of the asymmetricity. FIG. 14A shows the ununiformity of the application of the resist layer 43 on the substrate 42, where the thickness d of the resist layer 43 is 2.3 μm and the ununiformity of the application is 0.1 μm. In the conventional simple two-wavelength detection (which uses only the normal incident light), the waveform shown in FIG. 1B is produced. The detection waveform in the present embodiment is shown in FIG. 14C in which the asymmetricity in the detection waveform is significantly low, the distance Δx from the real center of the mark to the center of detection, that is, the detection error is reduced from 0.16 μm to 0.04 μm. As a a result, high precision detection is attained.

Other embodiment of the present invention is explained with reference to FIG. 7.

Figure 7:
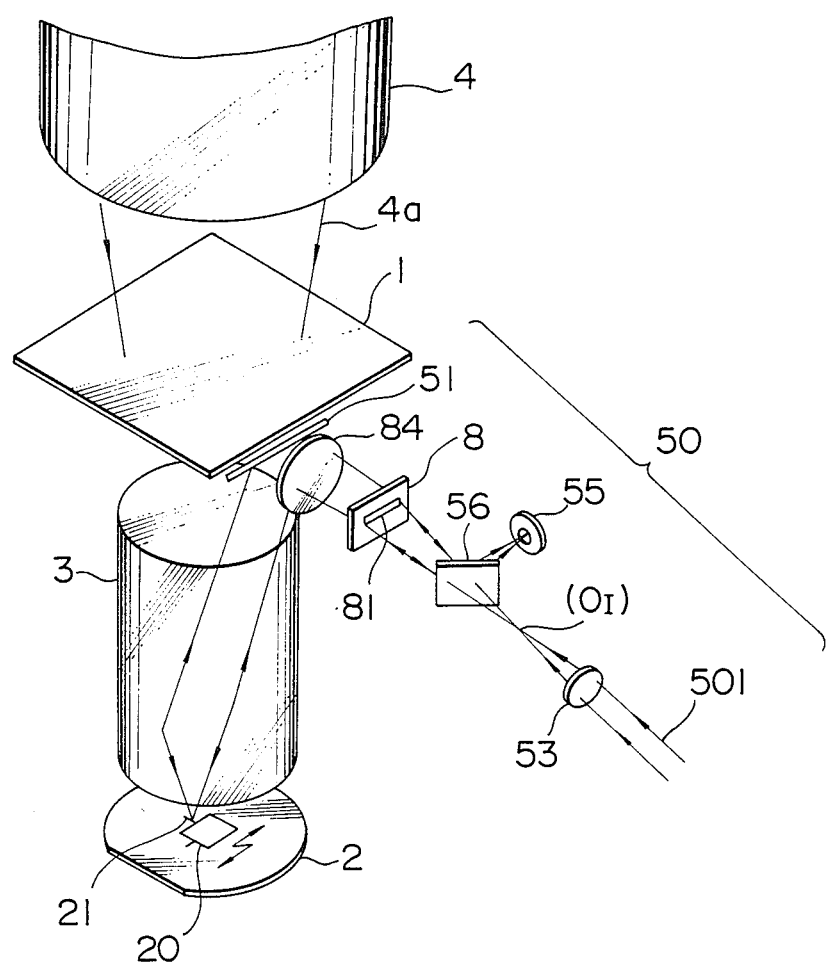
FIG. 7 shows other embodiment of a detection optical system of the present invention.
Figure 8A:
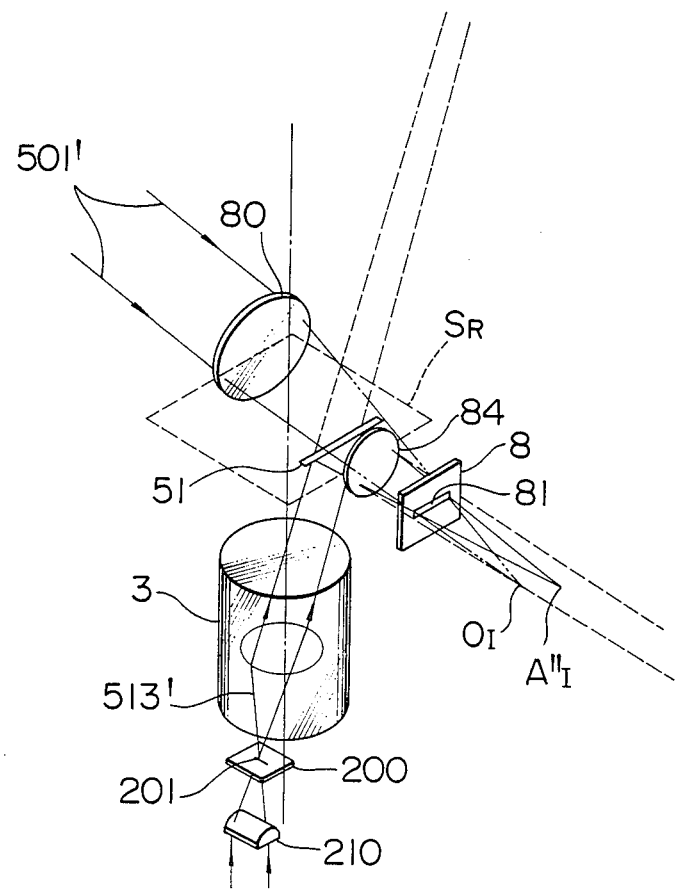
FIG. 8A shows an overall construction of other embodiment of the detection optical system of the present invention.
Figure 8B:
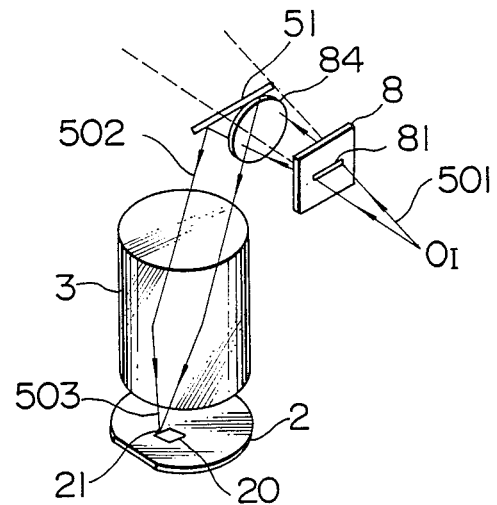
FIG. 8B illustrates a method for forming a hologram of FIG. 8A.
Figure 8C:
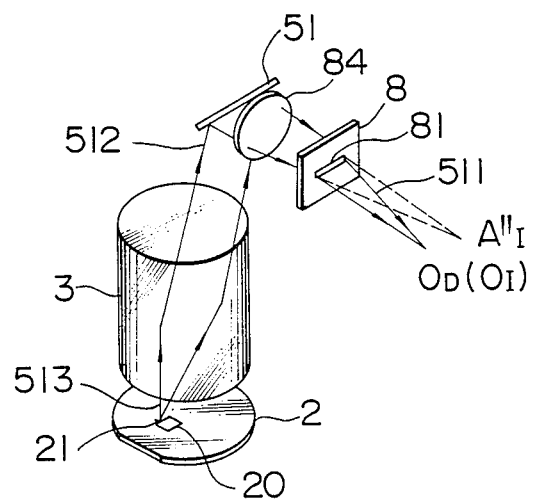
FIG. 8C illustrates a principle of a wafer illumination system of FIG. 8A.

FIG. 7 shows an embodiment which aims to solve the following problem. When detection is made by a visible light for the reduction lens 3 manufactured for an excimer exposure light having a short wavelength λ (for example, $\lambda_e=248.5$ nm) and if the reduction lens 3 is made of only quartz glass, an image of the wafer may not be a real image on a reticle side but may be a virtual image on a wafer side, because scattering of a refraction index of the quartz glass is high near 248.5 nm. If such a virtual image is formed, the light 501 produced by illuminating the alignment mark 21 on the wafer 2 by the visible light is largely spread after it has passed through the focusing lens 53. In the embodiment of FIG. 7, in order to solve the above problem, the spread light is focused by a convex lens 84 to reduce the beam diameter. As shown in FIG. 8A, the visible alignment light 513' emitted from the alignment mark on the wafer 1 (corresponding to the slit 201 of FIG. 8A) is focused by the convex lens 84 to a point $A_1''$. Appropriate spread is attained on the hologram recording medium 8 arranged at a mid-point of the focusing point $A_1''$ and the focusing lens 84. FIG. 8A shows a method for forming a hologram for compensating a wavefront aberration of the reduction lens optical system 3 which includes the convex lens 84. The detection laser beam 513' transmitted through the slit 201 is focused to $A_1''$ by the convex lens 84. The reference light 501 which is to be focused to a focusing point $O_1$ is overilluminated in an area which passes through the hologram recording medium 8 arranged in the light path to form the illumination and detection hologram 81 having the wavefront aberration compensation function. FIG. 8B shows a principle of an illumination system which uses the hologram 81 and the convex lens 84 to illuminate the alignment mark 21 of the wafer 2 with the spread corresponding to the width of the slit 201. By using the wavefront record function of the hologram 81, the light 512 which is focused at the point $D_f$ and reversely follows the light path of the reference light used to form the hologram 81, the wafer illumination with the narrow range corresponding to the width of the slit is attained. The light 513 irradiated to the alignment mark 21 on the wafer 2 and reflected therefrom passes through the reduction lens 3 and the convex lens 84 as shown in FIG. 8C, is directed to the hologram 81 and the 1-order diffracted light 511 is focused to the focusing point $O_D$. Accordingly, by illuminating the bar mark 21 by using the hologram 81 and detecting the image by the wafer alignment mark detection system 50 as shown in FIG. 7, the waveform signal of the alignment mark 21 is detected by the photo-detector 55 as the wafer is scanned in the direction of arrow.

Other embodiment of the present invention is explained with reference to FIGS. 9A, 9B and 9C.

Figure 9A:
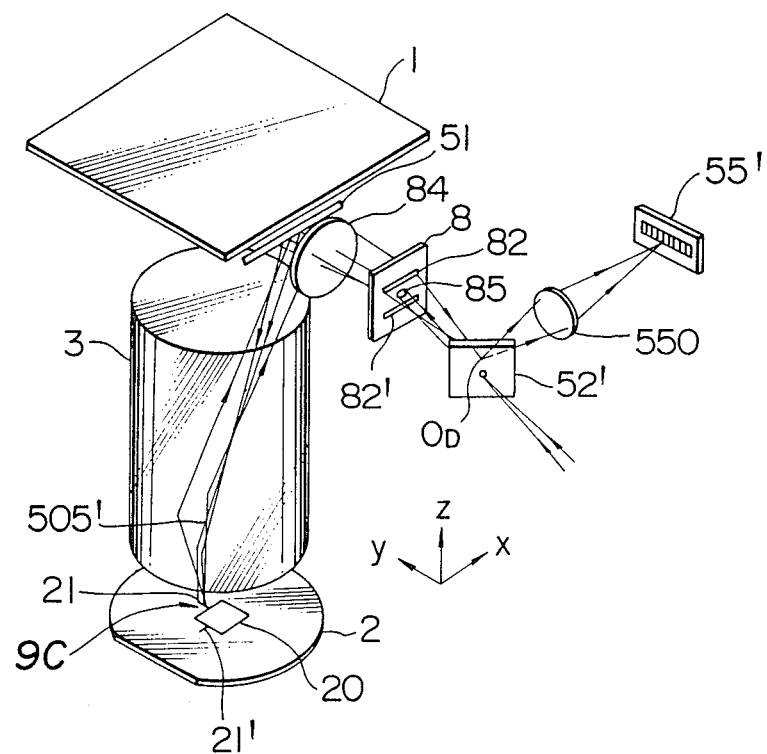
FIG. 9A shows an overall construction of other embodiment of the detection optical system of the present invention.
Figure 9B:
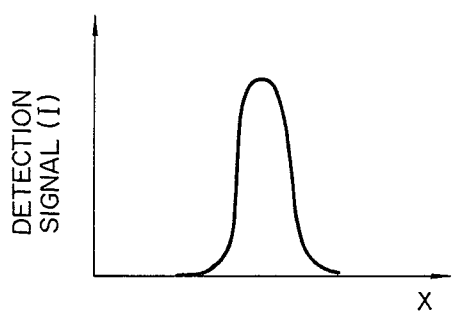
FIG. 9B shows a detection signal waveform detected by a detector of FIG. 9A.
Figure 9C:
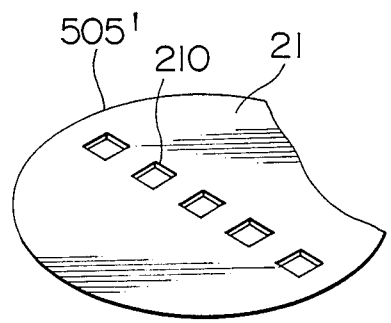
FIG. 9C shows an enlarged perspective view of an illumination light for illuminating a wafer of FIG. 9A.
Figure 10A:
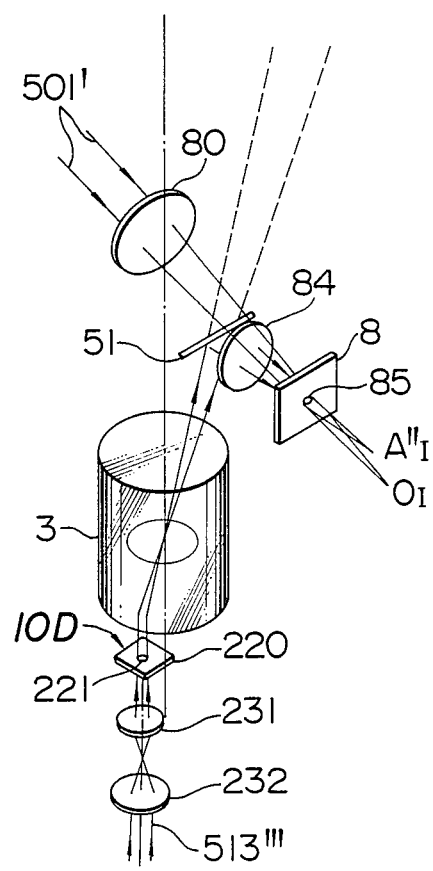
FIG. 10A shows an overall construction of other embodiment for forming a hologram in the present invention.
Figure 10B:
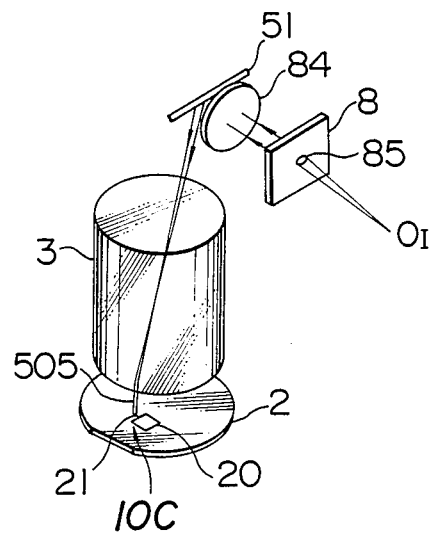
FIG. 10B illustrates a reproduced light of FIG. 10A.
Figure 10C:
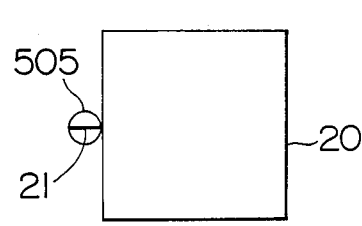
FIG. 10C shows an enlarged view of an illumination light for illuminating an alignment mark in a wafer of FIG. 10B.
Figure 10D:
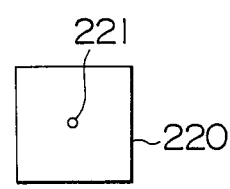
FIG. 10D shows an enlarged view of a pinhole plate of FIG. 10A.

In FIGS. 9A, 9B and 9C, the illumination light to the alignment mark of the wafer 20 is different from that of the previous embodiment. In FIG. 9A, the alignment mark illumination light does not illuminate a portion of the alignment mark 21 but widely illuminates the entire alignment mark 21 and the periphery thereof. The illumination light has a wavefront close to that of a collimated light on the surface of the wafer 2. The hologram 85 generates the illumination light. The hologram 85 is formed in a manner shown in FIG. 10D. a pinhole plate 220 is arranged at a position corresponding to the plane of the wafer 2. The pinhole plate 220 has a pinhole 221 having a slightly larger diameter than the width of the wafer alignment mark 21. A narrow collimated laser beam 513''' is irradiated to the pinhole 221 upward through collimeter lenses 231 and 232. The laser beam 513''' transmitted therethrough passes through the reduction lens 3, mirror 51 and convex lens 84, and illuminates the hologram recording medium 8 with a relatively narrow range (because the spread by the diffraction is narrow since the diameter of the pinhole 221 is larger than the slit width). On the other hand, the reference light 501' emitted from the same laser light source is focused by the lens 80 at the focusing point $D_I$ and superimposed on the light transmitted through the pinhole, on the hologram 85. The hologram 85 thus formed is reproduced by the reproducing light 505 emitted from the focusing point $O_I$ as shown in FIG. 10B so that a plane wave (collimated light) illumination light for illuminating the alignment mark on the wafer is produced as shown in an enlarged view of FIG. 10C. As shown in FIG. 10A, the illumination hologram 85 shown in FIGS. 10A and 10B as well as the hologram 82 (and 1-order diffracted light detecting hologram 82') for detecting the diffracted light 505' from the alignment mark 21 are recorded on the hologram recording medium 8. In the embodiment of FIG. 9A, the hologram 82 is formed by using the convex lens 84, unlike the embodiment of FIG. 1A. As shown in FIG. 15C, the hologram 82 is recorded by the reference light 511' having the wavefront of the light transmitted through the slit focused at the point $O_D$. As explained in the embodiment of FIG. 2A, the position of the detection diffracted light $O_D$ varies as the slit illumination light 503 (FIG. 2A) scans. As a result, the entire alignment mark 21 is illuminated as shown in FIG. 9A and it is detected by the hologram 82 so that the image of the alignment mark by the diffracted light 505' is formed at the position $O_D$. This image is focused on the one-dimension sensor 55' by the focusing lens 550 so that the detection signal of the alignment mark 21 is produced as shown in FIG. 9B. Thus, a high precision detection signal is detected without moving element. Numeral 52' denotes an apertured mirror.

Other embodiment of the present invention in which the hologram 82 is formed based on design data of the reduction lens 3 by using a charged particle drawing apparatus or laser beam drawing apparatus, and the alignment is detected by using the hologram 82 is explained. An electron beam (EB) drawing apparatus is used as the drawing apparatus. The wavefront aberration at the position of the hologram after the light having the alignment wavelength which passes through the aperture of the hologram forming mask arranged at the position corresponding to the plane of the wafer 2 for the reduction lens 3 is determined by calculation. Similarly, the wavefront at the position of the hologram of the reference light when the hologram is formed is also determined. Accordingly, an interference pattern of those lights at the hologram position can be determined by calculation. For example, an interference fringe intensity I(x,y) is given by:

$$I(x,Y) = |exp\{i\phi_{RL}(x,y)\} + exp\{i\phi_R(x,y)\}|^2 \quad (2)$$

where $\phi_{RL}(x,y)$ is a wavefront (phase) after the transmission through the reduction lens, and $\phi_R(x,y)$ is a wavefront (phase) of the reference light. Those areas which have larger I(x,y) than a mean intensity (=1) are transparent, and those area which have smaller I(x,y) are opaque. The binarized interference image is enlarged at a magnification factor of 5 by the EB drawing apparatus. Since a minimum draw unit is uniquely defined by the EB drawing apparatus, I(x,y) is sampled by the minimum draw unit and the draw data value at each sampling point is compared with the mean intensity (1) to prepare the EB draw data. Based on this data, the reticle is drawn by the EB raw apparatus. Since the reticle is 5 times as large as the final interference pattern of the hologram, it is mounted on a reticle stage of the reduction exposure apparatus and a glass wafer having resist applied thereon is mounted on a wafer stage, and the interference pattern of the reticle is reduced by a factor of 5. The exposed wafer is developed and the glass wafer is etched to form a desired step pattern to complete the hologram. Since a number of holograms are formed on the glass wafer, it is cut to pieces and one piece is mounted at the hologram position.

Since the wavefront aberration of the reduction lens is large, the light at the alignment light wavelength virtually emitted from the alignment mark on the wafer at the hologram position does not have a constant light amplitude at the hologram position but it is ununiform after it has been transmitted through the reduction lens. In this case, the interference fringe intensity is expressed as follows instead of the equation (2).

$$I(x,y) = |A_{RL}(x,y)exp\{i\phi_{RL}(x,y)\} + A_R(x,y)exp\{i\phi_R(x,y)\}|^2 \quad (3)$$

a first term in the absolute term of the equation (3) represents a composite amplitude on the hologram after the transmission through the reduction lens, and a second term represents a complex amplitude of the reference light on the hologram. Since the wavelength of the visible alignment light is approximately two times as large as that of the far ultraviolet exposure light, the alignment light $A_{RL}(x,y)exp\{i\phi_{RL}(x,y)\}$ at the hologram position is affected by various aberrations (such as spherical aberration, coma aberration and astigmatism)

of the reduction lens so that it is significantly deviated from a uniform plane wave or spherical wave. As a result, $A_{RL}(x,y)$ is not constant as it is in the equation (2) but significantly varies with x and y. In this case, the pattern drawn by the EB is expressed as follows.

A ridge of the fringe intensity distribution expressed by the equation (3) is determined as a center of fringe. A width $W(x,y)$ of the fringe $(x,y)$ is determined as a function of $A_{RL}(x,y)$ and $A_R(x,y)$.

$$W(x,y)=f(A_{RL}, A_R', p) \qquad (4)$$

where is a pitch between adjacent ridges or pitch of the interference fringe, and $f(A_{RL}, A_R:p)$ differs depending on whether the hologram is of amplitude modulation type or phase modulation type. The optimum function of f is chosen depending each of these two types of the holograms.

Figure 16A:
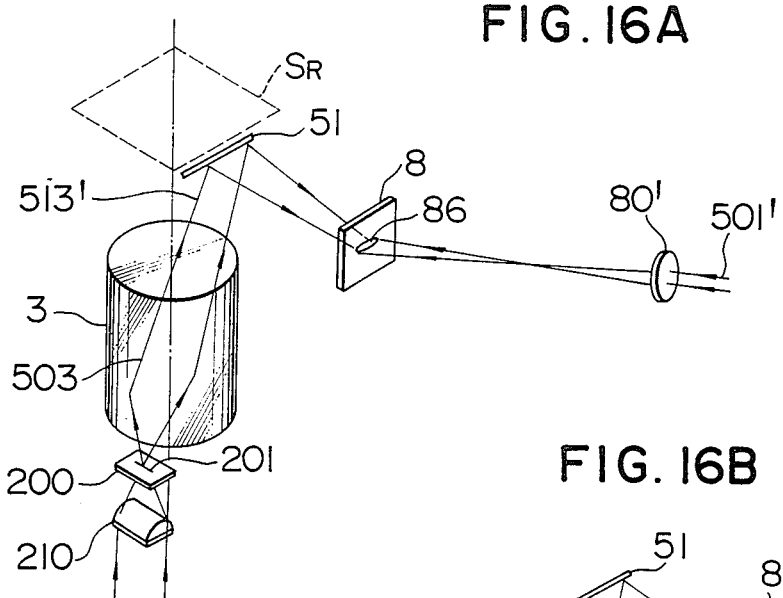
FIG. 16A shows an overall construction of an optical aligner for a semiconductor of the present invention which uses a reflection type hologram.
Figure 16B:
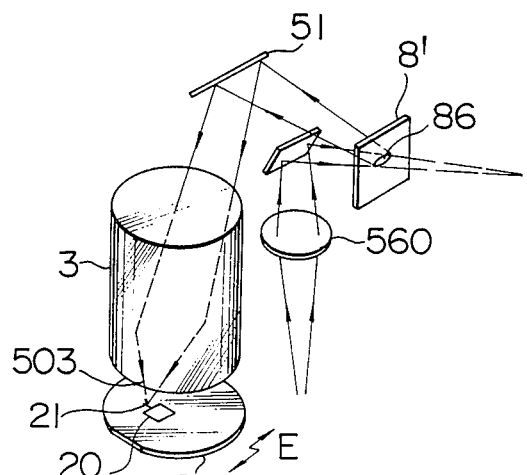
FIG. 16B illustrates a reproduced light of FIG. 16A.
Figure 16C:
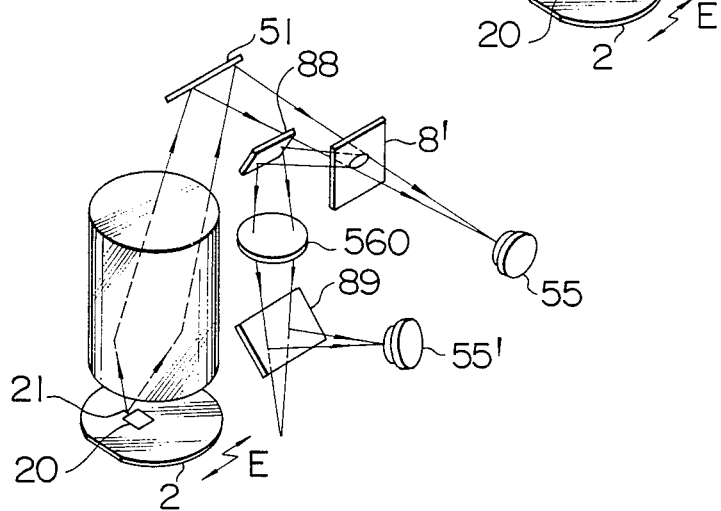
FIG. 16C illustrates a method for detecting a reflected light of FIG. 16A.

FIG. 16A, 16B and 16C show an embodiment which uses the reflection type hologram. The like elements to those shown in FIG. 15A are designated by the like numerals. FIG. 16A shows a method for forming the reflection type hologram 8'. It is different from the embodiment of FIG. 15A in that the reference light 501' used to form the hologram is directed to the hologram recording medium 8' in the reverse direction to the light 513' transmitted through the reduction lens 3. As is well known, the reflection type hologram three-dimensionally records the interference fringe created thickness-wise of the hologram on recording medium 8'. The hologram formed in FIG. 16A is used as shown in FIG. 16B so that the alignment mark 21 on the wafer 2 is illuminated by a narrow sheet beam. This is fundamentarily same as the formation of the transmission type hologram in FIG. 15B. The hologram reproducing light 501 is directed from the left and the reproduced diffracted light 503 is reflected to the left as shown in FIG. 16B. FIG. 16C shows a method for detecting the light irradiated from the reflection type hologram 8' as the reproduced diffracted light and reflected by the alignment mark 21 on the wafer 2. FIG. 16C shows two detection methods. In one method, the light transmitted through the hologram is detected by the detector 55, and in the other method, the light diffracted by the hologram 86 is detected by the detector 55'. The alignment mark is detected by moving the wafer in the direction E as is done in the embodiment of FIG. 1A.

While the transmission type hologram is used in the present embodiment, the reflection type hologram may be used in the present invention.

The illumination light to the alignment mark may be introduced from a clearance between the reduction lens and the wafer to illuminate the alignment mark, and the reflected scattered light from the alignment mark may be detected by using the detection hologram through the reduction lens. In this manner, a high precision alignment mark detection is attained.

In accordance with the present invention, the wafer alignment mark can be detected through the reduction lens by using the visible light having a sufficiently longer wavelength than that of the exposure light without affecting to the resist layer (fog) or without being affected by the resist layer (the wafer alignment mark is detectable). As a result, the following significant advantages are attained. (1) Since the alignment mark is detected through the reduction lens, the alignment precision is improved (from 0.15 μm to 0.08 μm) and the offset variation is reduced (from 0.05 μm to 0.03 μm). If other detection system than the reduction lens is provided, a variation of distance between the reduction lens optical axis and the detection system optical axis due to temperature change or vibration appears as an error as it is. When it is detected through the reduction lens, the variation in the detection system before the transmission through the reduction lens due to the temperature change or vibration is reduced to 1/5 (when the reduction lens having the reduction factor of 5 is used) after the transmission through the reduction lens. (2) If a light having a short wavelength close to that of the exposure light is used as the alignment detection light, the resist layer is exposed to the illumination light, the illumination light is hard to be transmitted through the resist layer, the level of the detection signal is significantly lowered, proper detector waveform is not produced and the detection precision is lowered. The present invention completely resolve the above problems. (3) As one measure to solve the problems of (2) above, the alignment mark on the wafer may be partially exposed to the light to remove the resist by developing. However, the addition of such a step increases the cost and the number of steps and lowers the yield. The method of the present invention is advantageous in the cost and yield. (4) A significant advantage of the present invention is to focus the alignment mark on the wafer without aberration and detect it. The reduction lens exhibits almost non-aberration focusing ability only to the exposure light but exhibits various aberrations to other wavelengths. The problem is severer as the wavelength is farther from the wavelength of the exposure light. It is not impossible to compensate for such aberrations by a lens system but the detection light optical axis does not match to the exposure light optical axis but it inclines relative to the exposure light optical axis. Accordingly, the compensation by the lens system is very difficult to attain. In accordance with the present invention, the aberration of the reduction lens is recorded on the hologram by its nature and the wavefront which includes the aberration is reproduced. Accordingly, the illumination and detection of the wafer without aberration (diffraction limit) are attained, and the high resolution detection which could not be attained by the alignment method of the conventional reduction exposure apparatus which uses a g-ray or i-ray reduction lens is attained at the wavelength other than the exposure light wavelength. As a result, the high alignment precision which could not be attained by the prior art reduction exposure apparatus is attained.

In the prior art apparatus, a light path correction optical system for correcting mismatching of focusing positions due to chromic aberration is used to solve a problem of chromic aberration of the reduction lens caused by two wavelengths. In the present alignment method which uses two wavelengths, it is possible to focus the images on one detector by one optical system without requiring additional optical system, and the construction of the apparatus is simplified and the cost is reduced. The affect of the ununiformity of application can be reduced by irradiating laser beams of single wavelength or multi-wavelength at different incident angles and combine the images.

We claim:

1. A method for optical alignment of a semiconductor by irradiating an exposure light to a mask having a fine pattern drawn thereon and directing the transmitted light therefrom to a wafer as a pattern image through an exposure reduction lens, comprising:

an alignment illumination step for illuminating an alignment mark on the wafer by an alignment light having a different wavelength than that of the exposure light;

an alignment detection step for detecting a reflected light of the alignment light through the exposure reduction lens to detect the position of the alignment mark on the wafer to align the wafer relative to the alignment mark; and compensation step for compensating for a wavefront aberration at the alignment wavelength of the exposure reduction lens by using a hologram in at least one of alignment illumination and alignment detection in the relative alignment.

2. A method for optical alignment of a semiconductor according to claim 1 further comprising:

a step for scanning the wafer relative to the alignment illumination light fixed at a predetermined position; and a step for detecting an intensity of the reflected light from the alignment mark on the wafer and detecting a scan position on the wafer to detect the position of the alignment mark on the wafer.

3. A method for optical alignment of a semiconductor to a light according to claim 1 further comprising:

a step for directing the reflected light from the alignment mark on the wafer to the hologram while using the hologram for detection; and a step for detecting the diffracted light from the hologram by an image sensor.

4. A method for optical alignment of a semiconductor according to claim 1 further comprising:

a step for using the hologram for illumination to the entire alignment mark on the wafer and the detection of the reflected light from the alignment mark;

a step for directing the reflected light from the alignment mark to the detection hologram; and a step for detecting the alignment mark for the diffracted light from the detection hologram while the wafer and the illumination light are fixed.

5. A method for optical alignment of a semiconductor according to claim 1 further comprising:

a step for directing the alignment mark illumination light generated by the hologram to the alignment mark at least two different incident angles; and a step for combining images formed by the illumination lights of different incident angles to produce a detection waveform.

6. A method for optical alignment of a semiconductor according to claim 1 further comprising:

a step for forming a hologram for a plurality of wavelengths;

a step for directing at least one of the laser beams to the alignment mark at least two different incident angles; and a step for combining detection waveforms of images produced by the illumination lights of different incident angles.

7. A method for optical alignment of a semiconductor according to claim 1 further comprising:

a step for forming a hologram for at least two wavelengths;

a step for directing laser beams of respective wavelength to the hologram; and a step for directing the illumination light from the hologram to the alignment mark to detect the alignment mark.

8. A method for optical alignment of a semiconductor according to claim 1 wherein the hologram interference fringe is a pattern determined by a theoretical interference fringe determined by a wavefront (phase) of the light having the alignment light wavelength virtually emitted from the alignment mark on the wafer, including a wavefront aberration generated at a hologram position after the transmission of the light through the exposure reduction lens, and an amplitude of the light, and a wavefront (phase) and an amplitude of a reference light.

9. A method for optical alignment of a semiconductor according to claim 1 further comprising:

a step for scanning the alignment illumination light formed by the hologram in the detection direction on the wafer while the wafer is fixed in the alignment mark detection mode.

10. A method for optical alignment of a semiconductor according to claim 1 further comprising:

a step for directing the alignment light transmitted through or reflected by the hologram used for the alignment illumination to the exposure reduction lens; and a step for illuminating a wafer areas of a relatively narrow width substantially equal to a resolution width of a diffraction limit determined by a number of aperture of the exposure reduction lens and the wavelength in a direction of detection of the position of the alignment mark on the wafer after the transmission through the exposure reduction lens.

11. A method for optical alignment of a semiconductor according to claim 7 further comprising:

a step for forming a hologram for a plurality of wavelengths;

a step for directing at least one of the laser beams to the alignment mark at least two different incident angles; and a step for combining detection waveforms of images produced by the illumination lights of different incident angles.

12. A method for optical alignment of a semiconductor according to claim 8 further comprising:

a step for drawing the pattern of the hologram based on the theoretical interference fringe by using a charged particle beam or laser beam drawing apparatus; and a step for compensating for a wavefront aberration at the alignment wavelength by using the drawn hologram pattern as a master.

13. A method for optical alignment of a semiconductor according to claim 9 further comprising:

a step for scanning the alignment illumination light by light deflection means.

14. A method for optical alignment of a semiconductor according to claim 9 further comprising:

a step for directing the reflected light from the alignment mark on the wafer to the hologram while using the hologram for detection; and a step for detecting the diffracted light from the hologram by an image sensor.

15. A method for optical alignment of a semiconductor according to claim 10 further comprising:

a step for directing the alignment mark illumination light generated by the hologram to the alignment mark at least two different incident angles; and a step for combining images formed by the illumination lights of different incident angles to produce a detection waveform.

16. A method for optical alignment of a semiconductor according to claim 10 further comprising:
a step for scanning the wafer relative to the alignment illumination light fixed at a predetermined position; and
a step for detecting an intensity of the reflected light from the alignment mark on the wafer and detecting a scan position on the wafer to detect the position of the alignment mark on the wafer.

17. A method for optical alignment of a semiconductor according to claim 10 further comprising:
a step for forming a hologram for at least two wavelengths;
a step for directing laser beams of respective wavelengths to the hologram; and
a step for directing the illumination light from the hologram to the alignment mark to detect the alignment mark.

18. A method for optical alignment of a semiconductor according to claim 10 further comprising:
a step for scanning the alignment illumination light formed by the hologram in the detection direction on the wafer while the wafer is fixed in the alignment mark detection mode.

19. A method for optical alignment of a semiconductor according to claim 17 further comprising:
a step for forming a hologram for a plurality of wavelengths;
a step for directing at least one of the laser beams to the alignment mark at least two different incident angles; and
a step for combining detection waveforms of images produced by the illumination lights of different incident angles.

20. A method for optical alignment of a semiconductor according to claim 18 further comprising:
a step for scanning the alignment illumination light by light deflection means.

21. A method for optical alignment of a semiconductor according to claim 18 further comprising:
a step for directing the reflected light from the alignment mark on the wafer to the hologram while using the hologram for detection; and
a step for detecting the diffracted light from the hologram by an image sensor.

22. An optical aligner for a semiconductor having an exposure light source for illuminating a circuit pattern formed on a mask and an exposure reduction lens for focusing the circuit pattern on a wafer to be processed, comprising:
alignment illumination means for directing an alignment light having a different wavelength than that of the exposure light source to an alignment mark on the wafer;
alignment detection means illuminated by said alignment illumination means for detecting the alignment light reflected from said alignment mark through said exposure reduction lens to align said wafer relative to said mask by said alignment mark; and
a hologram provided in at least one of said alignment illumination means and said alignment detection means for compensating a wavefront aberration at the alignment wavelength of said exposure reduction lens.

23. An optical aligner for a semiconductor according to claim 22 further comprising:
means for scanning said wafer,
wherein said alignment illumination means directs the illumination light to an illumination hologram and directs a diffracted light therefrom to the wafer while the wafer is scanned by said scan means, and said alignment detection means includes means for detecting the alignment mark on the wafer based on a change in time of the detection signal and a change in the scan position on the wafer.

24. An optical aligner for a semiconductor according to claim 22 wherein said alignment detector means includes a hologram and means for directing the reflected light from the alignment mark on the wafer to said detection hologram, and said alignment detection means includes are image sensor for detecting the diffracted light from said detection hologram.

25. An optical aligner for a semiconductor according to claim 22 wherein said alignment illumination means includes an illumination hologram for illuminating the entire alignment mark on the wafer and directs the reflected light from the alignment mark to the detection hologram, and includes an image sensor for detecting the diffracted light from the detection hologram.

26. An optical aligner for a semiconductor according to claim 22 wherein said alignment illumination means includes an illumination hologram directed to the alignment mark at different incident angles, and image combining means for combining images of the alignment mark illuminated by the illumination hologram.

27. An optical aligner for a semiconductor according to claim 22 wherein said alignment illumination means includes illumination light source means for generating a plurality of wavelengths, and an illumination hologram illuminated by the illumination light emitted from said illumination light source means for generating illumination lights of different wavelengths for illuminating the alignment mark, and said alignment detection means includes means for combining a plurality of images of the alignment mark produced by the illumination lights of different wavelengths.

28. An optical aligner for a semiconductor according to claim 22 wherein said alignment illumination means includes means for directing the illumination light having at least one of said plurality of wavelengths to the alignment mark at least two different incident angles, and said alignment detection means includes means for combining detection images of the alignment mark illuminated by said alignment illumination means.

29. An optical aligner for a semiconductor according to claim 22 wherein the hologram interference fringe is a pattern determined by a theoretical interference fringe determined by a wavefront (phase) of the light having the alignment light wavelength virtually emitted from the alignment mark on the wafer, including a wavefront aberration generated at a hologram position after the transmission of the light through the exposure reduction lens, and an amplitude of the light, and a wavefront (phase) and an amplitude of a reference light.

30. An optical aligner for a semiconductor according to claim 22 further comprising:
means for scanning the alignment illumination light on the fixed wafer by varying a relative position of said illumination hologram and the laser beam,
wherein said alignment detection means scans the alignment illumination light to detect the alignment mark on the fixed wafer.

31. An optical aligner for a semiconductor according to claim 22 wherein said alignment illumination means includes said hologram and means for directing the laser beam transmitted through or reflected by said hologram to said exposure reduction lens, and said alignment illumination means illuminates a wafer area of a relatively narrow width substantially equal to a resolution width of a diffraction limit determined by a number of aperture of said exposure reduction lens and the wavelength, in a direction of detection of the position of the alignment mark on the wafer after the alignment light has passed through said exposure reduction lens.

32. An optical aligner for a semiconductor according to claim 29 further comprising:
means for correcting a wavefront at the alignment waveform by using a pattern of the hologram drawn by a charged particle beam or laser beam based on the theoretical interference fringe.

33. An optical aligner for a semiconductor according to claim 30 wherein the means for scanning the alignment illumination light is light deflection means.

34. An optical aligner for a semiconductor according to claim 30 wherein said alignment detection means includes a hologram and means for directing the reflected light from the alignment mark on the wafer to said detection hologram, and said alignment detection means includes an image sensor for detecting the diffracted light from said detection hologram.

35. An optical aligner for a semiconductor according to claim 31 further comprising:
means for scanning said wafer,
wherein said alignment illumination means directs the illumination light to an illumination hologram and directs a diffracted light therefrom to the wafer while the wafer is scanned by said scan means, and said alignment detection means includes means for detecting the alignment mark on the wafer based on a change in time of the detection signal and a change in the scan position on the wafer.

36. An optical aligner for a semiconductor according to claim 31 wherein said alignment illumination means includes an illumination hologram directed to the alignment mark at different incident angles, and image combining means for combining images of the alignment mark illuminated by the illumination hologram.

37. An optical aligner for a semiconductor according to claim 31 wherein said alignment illumination means includes illumination light source means for generating a plurality of wavelengths, and an illumination hologram illuminated by the illumination light emitted from said illumination light source means for generating illumination lights of different wavelengths for illuminating the alignment mark, and said alignment detecttion means includes means for combining a plurality of images of the alignment mark produced by the illumination lights of different wavelengths.

38. An optical aligner for a semiconductor according to claim 31 further comprising:
means for scanning the alignment illumination light on the fixed wafer by varying a relative position of said illumination hologram and the laser beam,
wherein said alignment detection means scans the alignment illumination light to detect the alignment mark on the fixed wafer.

39. An optical aligner for a semiconductor according to claim 38 wherein said alignment detection means includes a hologram and means for directing the reflected light from the alignment mark on the wafer to said detection hologram, and said alignment detection means includes an image sensor for detecting the diffracted light from said detection hologram.

40. An optical aligner for a semiconductor according to claim 38 wherein the means for scanning the alignment illumination light is light deflection means.

* * * * *